(12) United States Patent
Luo et al.

(10) Patent No.: US 12,488,925 B2
(45) Date of Patent: Dec. 2, 2025

(54) POWER MODULE AND MANUFACTURING METHOD THEREOF

(71) Applicant: Delta Electronics, Inc., Taoyuan (TW)

(72) Inventors: Quansong Luo, Taoyuan (TW); Xi Liu, Taoyuan (TW); Xueliang Chang, Taoyuan (TW); Zhengyu Ye, Taoyuan (TW); Wenhua Li, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 950 days.

(21) Appl. No.: 17/529,173

(22) Filed: Nov. 17, 2021

(65) Prior Publication Data

US 2022/0208430 A1    Jun. 30, 2022

(30) Foreign Application Priority Data

Dec. 30, 2020 (CN) .......................... 202011605865.2

(51) Int. Cl.
| | |
|---|---|
| H01F 27/02 | (2006.01) |
| H01F 7/02 | (2006.01) |
| H01F 27/24 | (2006.01) |
| H01F 41/00 | (2006.01) |
| H02M 3/00 | (2006.01) |

(52) U.S. Cl.
CPC ......... *H01F 27/022* (2013.01); *H01F 7/0231* (2013.01); *H01F 27/24* (2013.01); *H01F 41/005* (2013.01); *H02M 3/003* (2021.05)

(58) Field of Classification Search
CPC ....... H01F 27/022; H01F 7/0231; H01F 27/24
USPC .............................................. 336/65, 90, 98
See application file for complete search history.

(56) References Cited

U.S. PATENT DOCUMENTS

| | | | | |
|---|---|---|---|---|
| 5,353,001 A | * | 10/1994 | Meinel ................ | H01F 17/0006 336/200 |
| 5,469,334 A | * | 11/1995 | Balakrishnan .......... | H02M 3/28 333/185 |
| 9,083,332 B2 | * | 7/2015 | Ikriannikov ............ | H01L 25/16 |

(Continued)

FOREIGN PATENT DOCUMENTS

| | | |
|---|---|---|
| CN | 201336316 Y | 10/2009 |
| CN | 103681647 A | 3/2014 |

(Continued)

*Primary Examiner* — Shawki S Ismail
*Assistant Examiner* — Joselito S. Baisa
(74) *Attorney, Agent, or Firm* — KIRTON McCONKIE; Evan R. Witt

(57) ABSTRACT

The present disclosure provides a power module and a manufacturing method thereof. The power module includes a substrate, an electronic component, a magnetic component and an encapsulation layer. The substrate includes a first surface and a second surface opposite to each other, and a working region. The working region is disposed on the first surface or the second surface. The electronic component is disposed on the substrate. The magnetic component is disposed on the working region and includes a lateral periphery. The encapsulation layer is disposed on the substrate, covers the electronic component and at least partially surrounds the lateral periphery of the magnetic component. A projection of the encapsulation layer on the first surface of the substrate is not overlapped with a projection of the working region on the first surface, and a gap is formed between the encapsulation layer and the lateral periphery of the magnetic component.

15 Claims, 33 Drawing Sheets

(56) References Cited

U.S. PATENT DOCUMENTS

| | | | | |
|---|---|---|---|---|
| 9,088,332 | B2* | 7/2015 | Boudreau | H04W 16/10 |
| 10,535,461 | B2* | 1/2020 | Oguchi | H01F 27/327 |
| 11,270,974 | B2* | 3/2022 | Yang | H01L 23/3677 |
| 2009/0008766 | A1* | 1/2009 | Chang | H01L 23/5389 |
| | | | | 257/691 |
| 2009/0065920 | A1* | 3/2009 | Ahn | H01L 23/5389 |
| | | | | 438/106 |
| 2012/0287582 | A1 | 11/2012 | Vinciarelli et al. | |
| 2014/0218155 | A1* | 8/2014 | Akre | H05K 1/141 |
| | | | | 29/832 |
| 2015/0006415 | A1* | 1/2015 | Xu | G06Q 10/105 |
| | | | | 705/320 |
| 2015/0062989 | A1* | 3/2015 | Su | H05K 1/0373 |
| | | | | 361/748 |
| 2015/0282370 | A1* | 10/2015 | Yang | H01F 5/00 |
| | | | | 361/736 |
| 2021/0125958 | A1* | 4/2021 | Yang | H01L 24/92 |
| 2021/0274656 | A1* | 9/2021 | Xiong | H01F 27/263 |

FOREIGN PATENT DOCUMENTS

| | | | |
|---|---|---|---|
| CN | 108109972 | A | 6/2018 |
| CN | 207868190 | U | 9/2018 |
| CN | 107026137 | B | 10/2019 |
| CN | 110602923 | A | 12/2019 |
| CN | 111106074 | A | 5/2020 |
| CN | 111952293 | A | 11/2020 |
| CN | 110602923 | B | 1/2021 |

* cited by examiner

POWER MODULE AND MANUFACTURING METHOD THEREOF

FIELD OF THE INVENTION

The present disclosure relates to a power module, and more particularly to a power module and a manufacturing method thereof for optimizing a transformer not overlapped by encapsulation material.

BACKGROUND OF THE INVENTION

A conventional power module, such as a DC/DC converter, usually includes a power device, a magnetic component, a circuit board and so on. The circuit board is used to carry the power device and the magnetic component, so that the power device and the magnetic component are connected through the circuit board. For example, the magnetic component is a transformer and includes a magnetic core and a winding. After the magnetic component and the circuit board are assembled together, the entire assembly is further encapsulated by the encapsulation material, so that the magnetic component is encapsulated in the encapsulation material completely. However, after the encapsulation material is cured, a stress is generated easily, and it results in such as the increase of power loss of the magnetic component and the change of the parameters of the magnetic component.

Therefore, there is a need of providing a power module and a manufacturing method to obtain an optimized and structural stable assembly by unencapsulting the magnetic component, simplify the procedure and overcome the above drawbacks encountered in the prior art.

SUMMARY OF THE INVENTION

In accordance with an aspect of the present disclosure, a power module is provided and includes a substrate, an electronic component, a magnetic component and an encapsulation layer. The substrate includes a first surface, a second surface and a working region. The first surface and the second surface are opposite to each other, and the working region is disposed on the first surface or the second surface. The electronic component is disposed on the substrate. The magnetic component is disposed on the working region of the substrate and has a lateral periphery. The encapsulation layer is disposed on the substrate, covers the electronic component and at least partially surrounds the lateral periphery of the magnetic component. A projection of the encapsulation layer on the first surface of the substrate is not overlapped with a projection of the working region on the first surface of the substrate, and a gap is formed between the encapsulation layer and the lateral periphery of the magnetic component.

In accordance with another aspect of the present disclosure, a manufacturing method of a power module is provided and includes steps of: (a) providing a substrate, wherein the substrate includes a first surface, a second surface and at least one working region, the first surface and the second surface are opposite to each other, and the at least one working region is disposed on the first surface or the second surface; (b) providing an electronic component disposed on the substrate; (c) forming an encapsulation layer disposed on the substrate and covering the electronic component, wherein a projection of the encapsulation layer on the first surface of the substrate is not overlapped with a projection of the working region on the first surface of the substrate; and (d) providing a magnetic component disposed on the working region of the substrate, so that the encapsulation layer at least partially surrounds a lateral periphery of the magnetic component, wherein a gap is formed between the encapsulation layer and the lateral periphery of the magnetic component.

In accordance with a further aspect of the present disclosure, a manufacturing method of a power module is provided and includes steps of: (a) providing a panel including a plurality of substrates, wherein the plurality of substrates are arranged in an array, and each of the plurality of substrates includes a first surface, a second surface and a working region; (b) providing a plurality of electronic components correspondingly disposed on the plurality of substrates, respectively, wherein the plurality of electronic components are corresponding to the plurality of working regions; (c) forming a plurality of encapsulation layers by a one-time molding process to cover the corresponding electronic components, respectively, wherein a projection of the respective encapsulation layer on the first surface of the substrate is not overlapped with a projection of the corresponding working region on the first surface of the substrate; and (d) providing a plurality of magnetic components, wherein each of the plurality of magnetic components is disposed on the corresponding working region of the substrate, respectively, so that the corresponding encapsulation layer at least partially surrounds a lateral periphery of the magnetic component, respectively, wherein a gap is formed between the corresponding encapsulation layer and the lateral periphery of the magnetic component.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
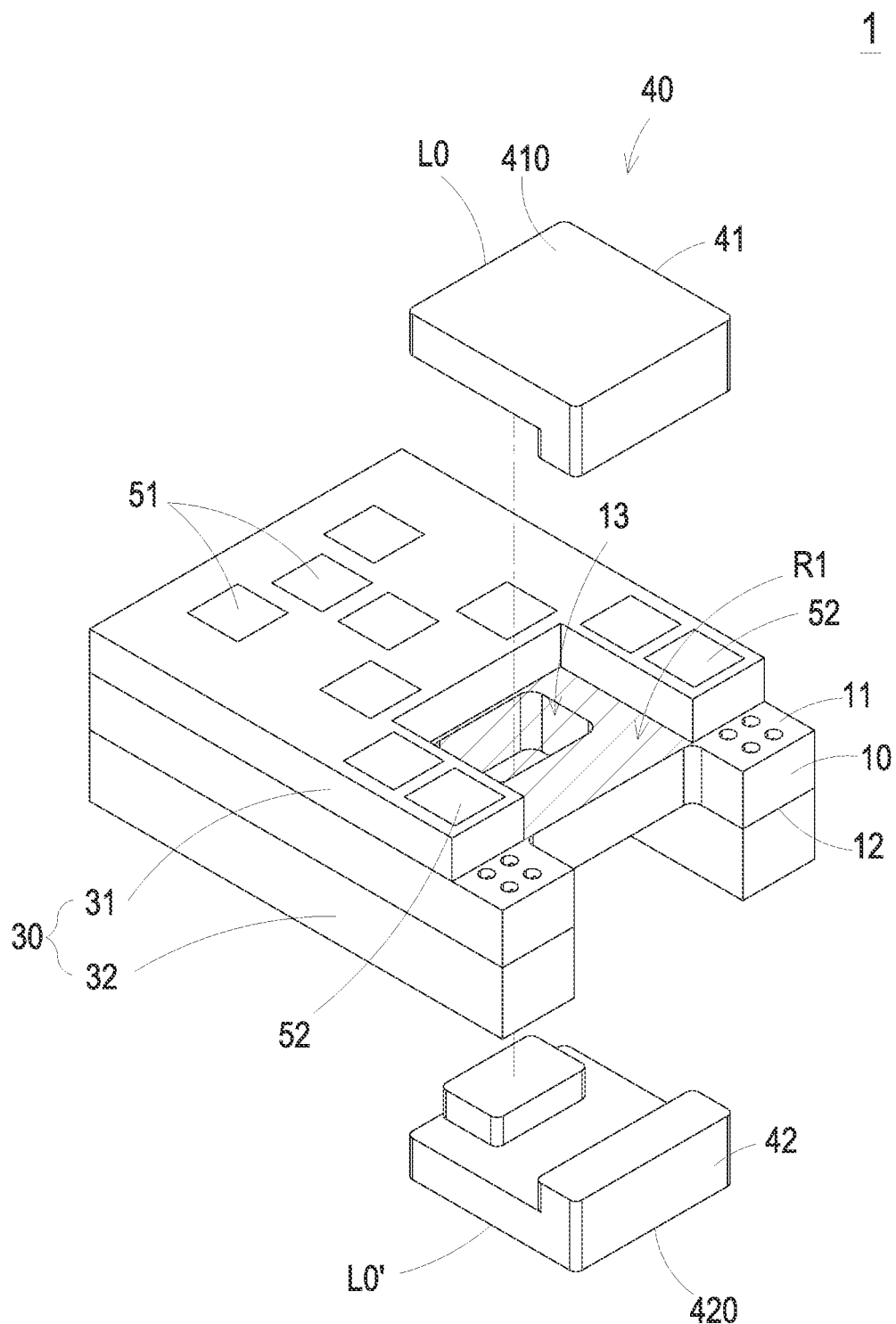
FIG. 1A is an exploded view illustrating a power module according to a first embodiment of the present disclosure.
Figure 1B:
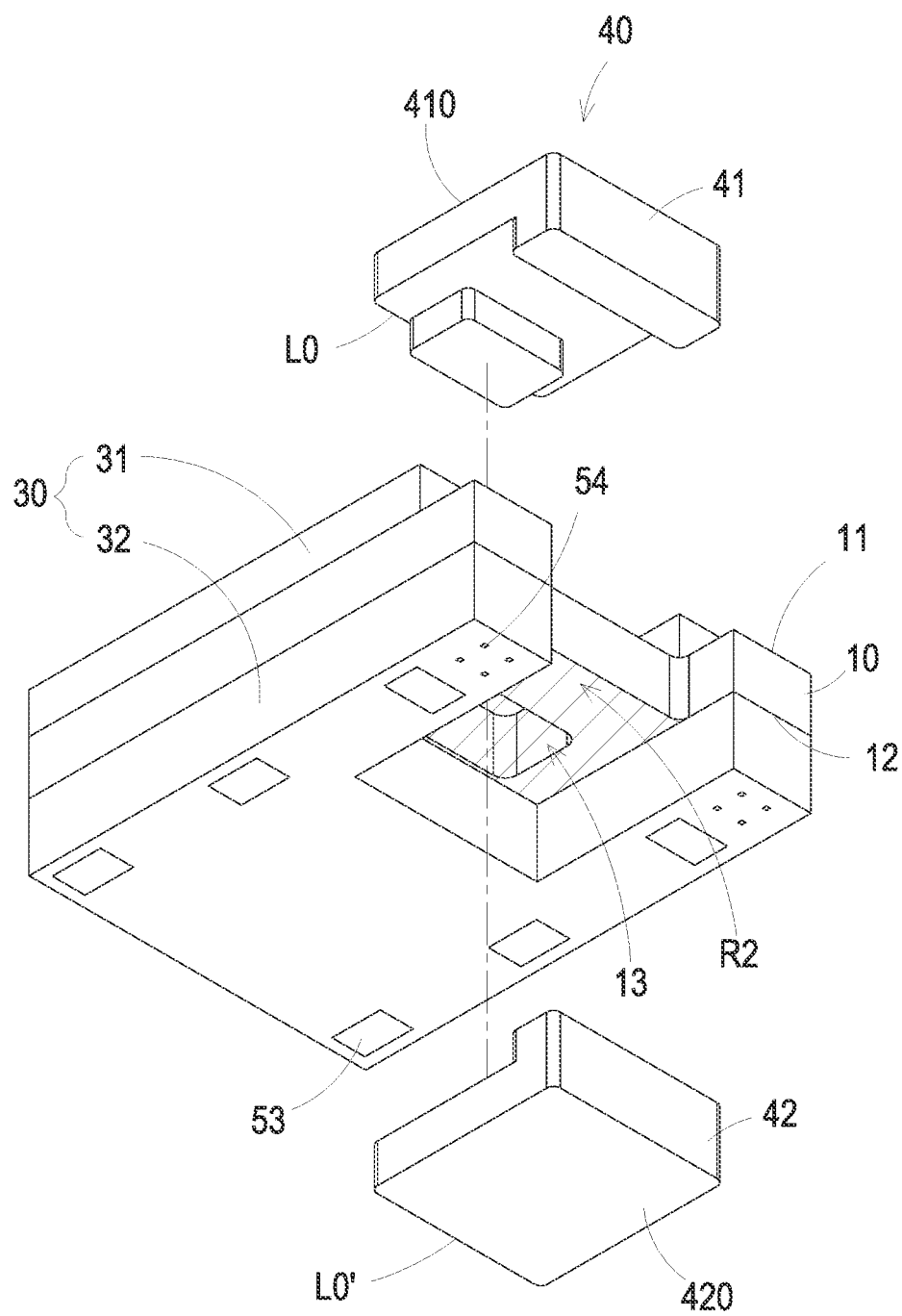
FIG. 1B is an exploded view illustrating the power module according to the first embodiment of the present disclosure and taken from another perspective.
Figure 2A:
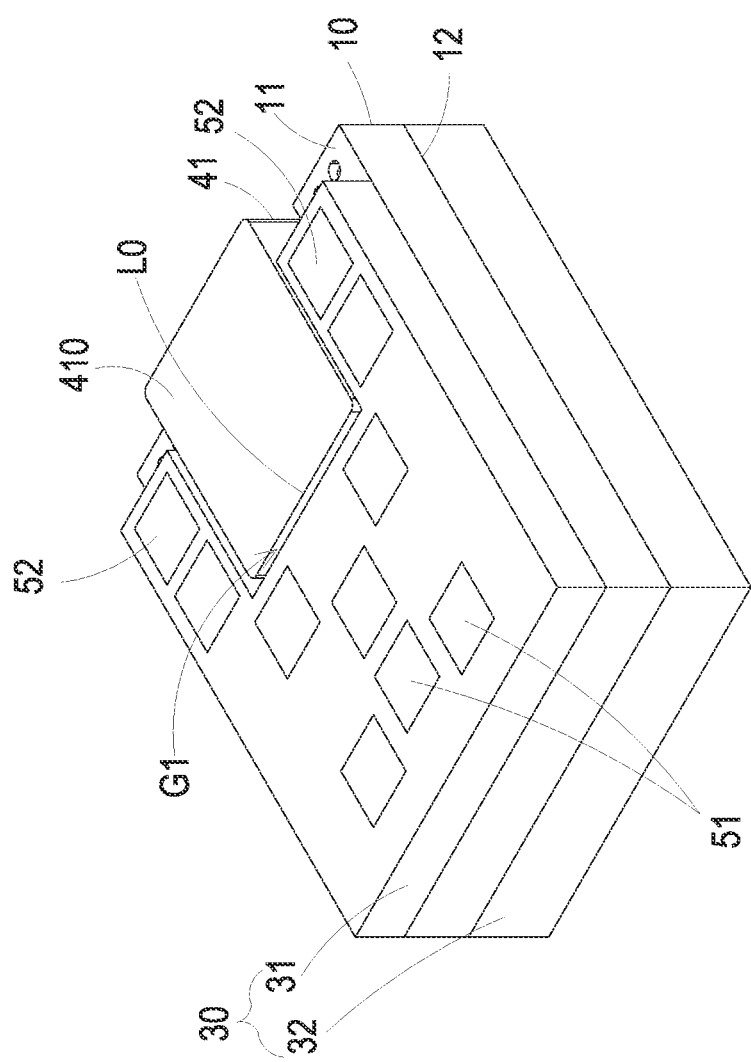
FIG. 2A is a perspective structural view illustrating the power module according to the first embodiment of the present disclosure.
Figure 2B:
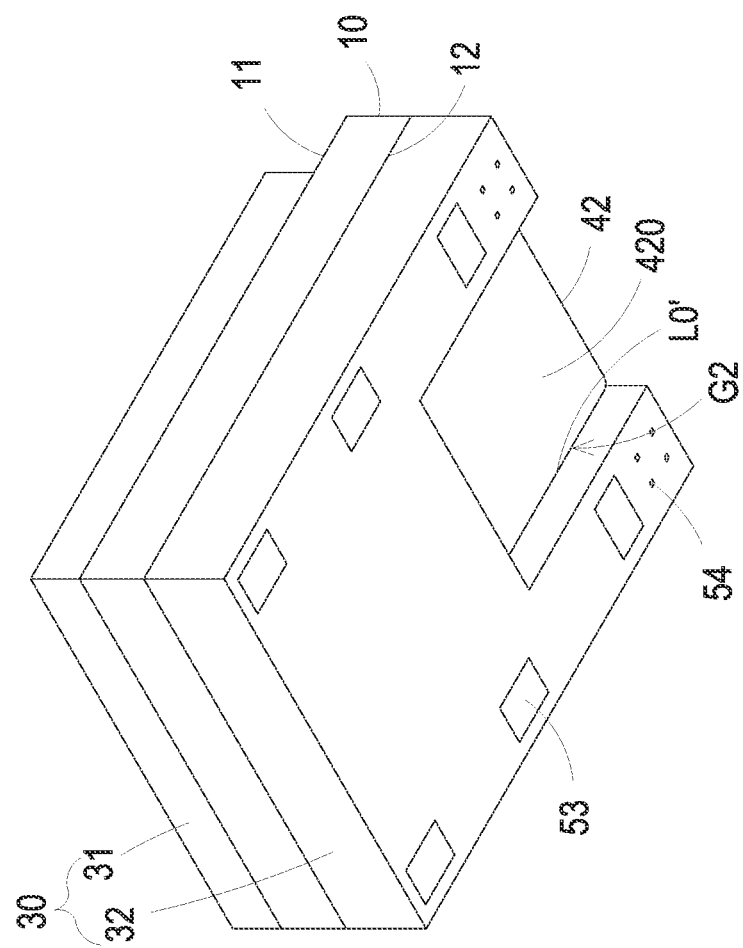
FIG. 2B is a perspective structural view illustrating the power module according to the first embodiment of the present disclosure and taken from another perspective.
Figure 3:
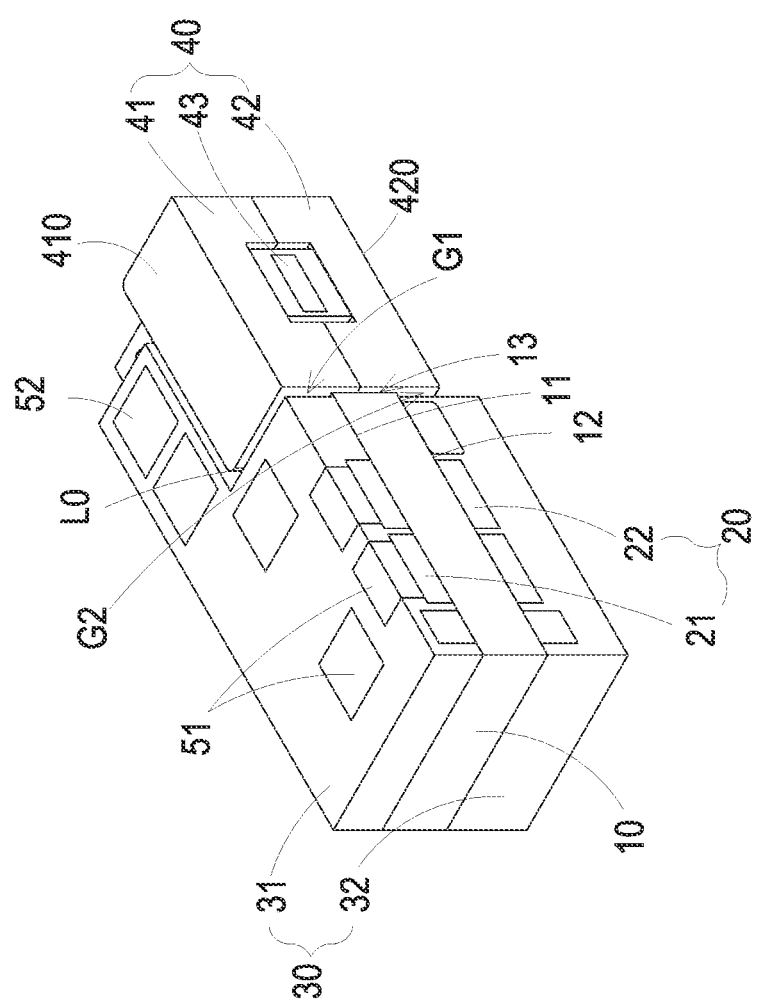
FIG. 3 is a cross-sectional view illustrating the power module according to the first embodiment of the present disclosure.
Figure 4A:
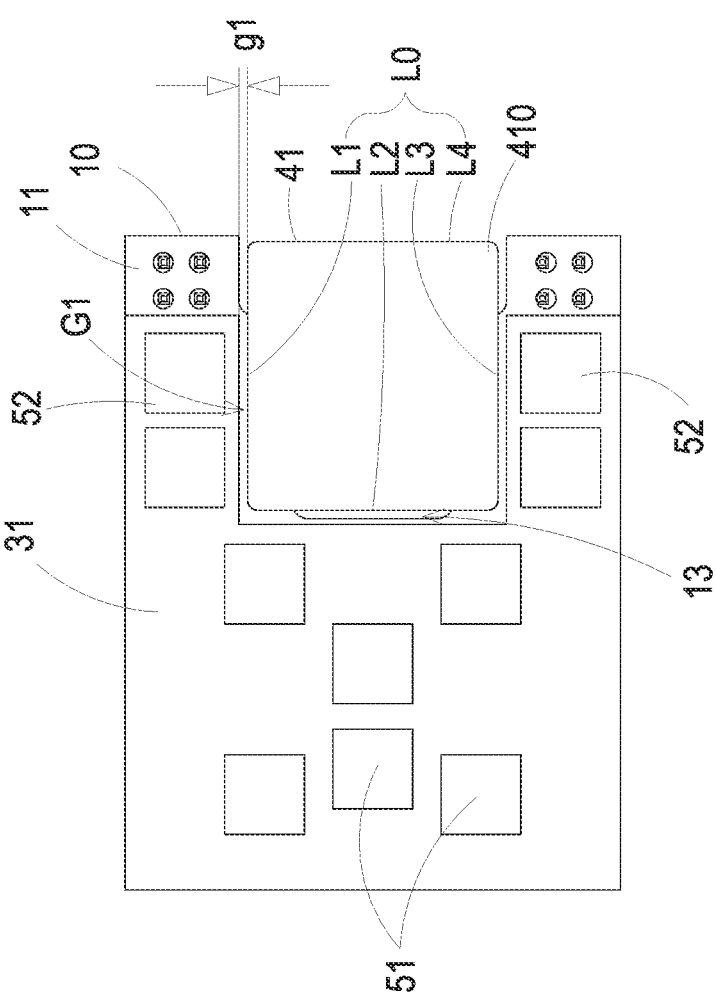
FIG. 4A is a top view illustrating the power module according to the first embodiment of the present disclosure.
Figure 4B:
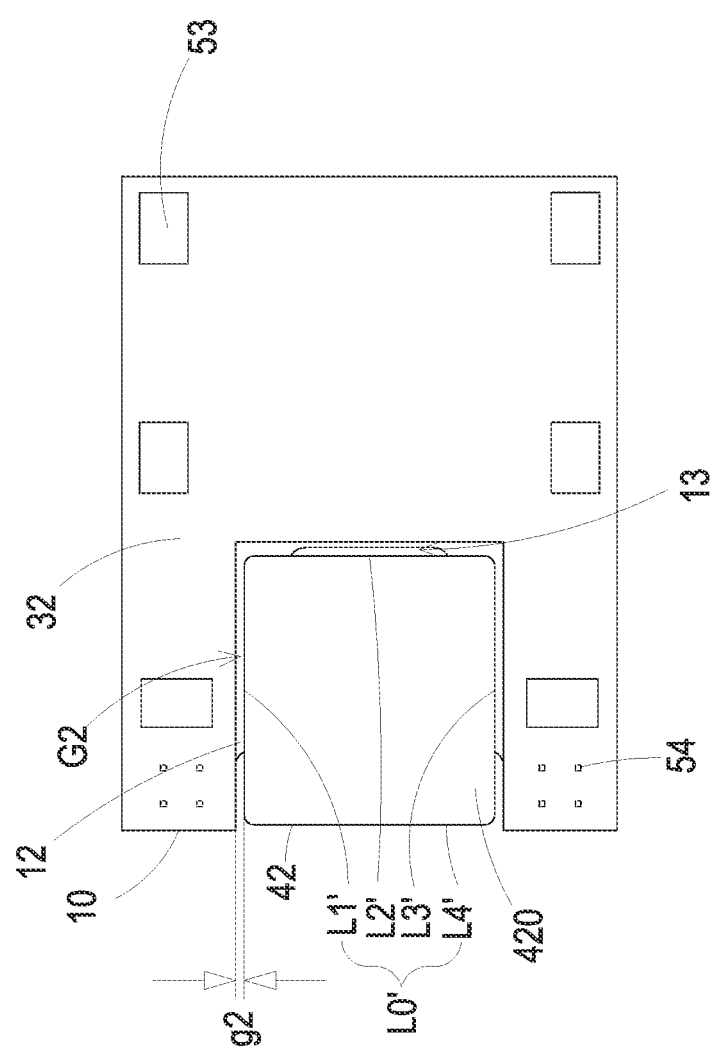
FIG. 4B is a bottom view illustrating the power module according to the first embodiment of the present disclosure.

FIG. 1A is an exploded view illustrating a power module according to a first embodiment of the present disclosure. FIG. 1B is an exploded view illustrating the power module according to the first embodiment of the present disclosure and taken from another perspective. FIG. 2A is a perspective structural view illustrating the power module according to the first embodiment of the present disclosure. FIG. 2B is a perspective structural view illustrating the power module according to the first embodiment of the present disclosure and taken from another perspective. FIG. 3 is a cross-sectional view illustrating the power module according to the first embodiment of the present disclosure. FIG. 4A is a top view illustrating the power module according to the first embodiment of the present disclosure. FIG. 4B is a bottom view illustrating the power module according to the first embodiment of the present disclosure. In the embodiment, the power module 1 includes a substrate 10, one or more electronic component 20, an encapsulation layer 30 and a magnetic component 40. Preferably but not exclusively, the substrate 10 is a printed circuit board and includes a first surface 11, a second surface 12 and at least one working region. The first surface 11 and the second surface 12 of the substrate 10 are opposite to each other. In the embodiment, a working region R1 is defined on the first surface 11 of the substrate 10, and another working region R2 is defined on the second surface 12 of the substrate 10. In other embodiments, the working region R1 is disposed on the first surface 11 merely. Alternatively, the working region R2 is disposed on the second surface 12 merely.

Preferably but not exclusively, in the embodiment, the electronic component 20 includes a first electronic component 21 and a second electronic component 22. Preferably but not exclusively, the electronic component 20 may be a resistor, a capacitor or a semiconductor device. In the embodiment, the first electronic component 21 is disposed on the first surface 11, and the second electronic component 22 is disposed on the second surface 12. In other embodiments, one of the first electronic component 21 and the second electronic component 22 is omitted, that is, the electronic component 20 is disposed on only the one of the first surface 11 and the second surface 12. The present disclosure is not limited thereto.

Preferably but not exclusively, in the embodiment, the encapsulation layer 30 includes a first encapsulation layer 31 and a second encapsulation layer 32. The first encapsulation layer 31 is disposed on the first surface 11 of the substrate 10 and covers the first electronic component 21 on the first surface 11. The second encapsulation layer 32 is disposed on the second surface 12 of the substrate 10 and covers the second electronic component 22 on the second surface 12. In other embodiments, the first encapsulation layer 31 corresponding to the first electronic component 21 or the second encapsulation layer 32 corresponding to the second electronic component 22, is omitted. Namely, one of the first encapsulation layer 31 and the second encapsulation layer 32 is omitted. The present disclosure is not limited thereto. Notably, the encapsulation layer 30 is disposed on the substrate 10 and covers the electronic component 20.

In the embodiment, the magnetic component 40 includes a first magnetic core 41, a second magnetic core 42 and a planar winding 43 (referring to FIG. 3) disposed in the substrate 10. Moreover, at least one perforation 13 is disposed in the working region R1 and the working region R2. The first magnetic core 41 and the second magnetic core 42 are combined to form a magnetic assembly, disposed on the first surface 11 and the second surface 12, respectively, and fastened to the substrate 10 through the perforation 13. Certainly, the present disclosure is not limited thereto. In another embodiment, the magnetic component 40 is a discrete magnetic component, which is formed into one piece by a winding and a magnetic powder material and surface-mounted on the working region. Also in another embodiment, the magnetic component 40 includes a winding, a bobbin and a magnetic core. Firstly, the winding is wound on the bobbin and assembled into a whole with the magnetic core. Then, the magnetic component 40 is disposed in the working region of the substrate 10, and fixed through the pad or the solder hole disposed on the substrate 10 to realize the electrical connection with the electronic component 20.

Notably, in the embodiment, the first magnetic core 41 includes a lateral periphery L0, and the first magnetic core 41 is assembled in the working region R1 on the first surface 11 of the substrate 10. The second magnetic core 42 includes a lateral periphery L0', and the second magnetic core 42 is assembled in the working region R2 on the second surface 12 of the substrate 10. In addition, when the magnetic component 40 is disposed on the substrate 10, the first encapsulation layer 31 at least partially surrounds the lateral periphery L0 of the first magnetic core 41 of the magnetic component 40. Namely, the lateral periphery L0 of the first magnetic core 41 is surrounded by the first encapsulation layer 31 partially or completely. A projection of the first encapsulation layer 31 on the first surface 11 of the substrate 10 is not overlapped with a projection of the working region R1 on the first surface 11 of the substrate 10. Namely, the projections of the first encapsulation layer 31 and the working region R1 are misaligned with each other on the first surface 11. Moreover, a gap G1 is formed between the first encapsulation layer 31 and the lateral periphery L0 of the first magnetic core 41 of the magnetic component 40. The gap G1 has a minimum gap distance g1. Preferably but not exclusively, the minimum gap distance g1 is greater than or equal to 0.2 mm. In the embodiment, when the magnetic component 40 is disposed on the substrate 10, the second encapsulation layer 32 at least partially surrounds the lateral periphery L0' of the second magnetic core 42 of the magnetic component 40. Namely, the lateral periphery L0' of the second magnetic core 42 is surrounded by the second encapsulation layer 32 partially or completely. A projection of the second encapsulation layer 32 on the first surface 11 is not overlapped with a projection of the working region R2 on the first surface 11. Namely, the projections of the second encapsulation layer 32 and the working region R2 are misaligned with each other on the first surface 11. Moreover, a gap G2 is formed between the second encapsulation layer 32 and the lateral periphery L0' of the second magnetic core 42 of the magnetic component 40. The gap G2 has a minimum gap distance g2. Preferably but not exclusively, the minimum gap distance g2 is greater than or equal to 0.2 mm. Preferably but not exclusively, the first magnetic core 41 and the second magnetic core 42 are arranged symmetrically on both sides of the substrate 10, and the working region R1 and the working region R2 are overlapped with each other, that is, the projections of the working region R1 and the working region R2 on the first surface 11 of the substrate 10 are overlapped completely. Certainly, the present disclosure is not limited thereto. Preferably but not exclusively, in the embodiment, the encapsulation layer 30 is formed by optimizing the encapsulation mould, which is misaligned with the working region R1 and the working region R2 where the magnetic component 40 is fastened therein. Preferably but not exclusively, a molding process is performed to form the encapsulation layer 30 on the substrate 10 before the substrate 10 is assembled with the magnetic component 40, so that the encapsulation material is not tightly wrapped or in contact with the first magnetic core 41 and the second magnetic core 42 of the magnetic component 40. Moreover, since the gap G1 formed between the encapsulation layer 30 and the first magnetic core 41 of the magnetic component 40 and the gap G2 formed between the encapsulation layer 30 and the second magnetic core 42 of the magnetic component 40 are greater than or equal to 0.2 mm, it avoids a transformer-parameter change caused by the stress generated between the encapsulation layer 30 and the transformer. Thus, it prevents the increase of the loss of the transformer.

Preferably but not exclusively, in the embodiment, the lateral periphery L0 of the first magnetic core 41 includes four lateral edges L1, L2, L3, L4, and the first encapsulation layer 31 surrounds the three lateral edges L1, L2, L3, as shown in FIG. 4A. Preferably but not exclusively, in another embodiment, the first encapsulation layer 31 surrounds the two lateral edges L1, L2. In other embodiment, the first encapsulation layer 31 surrounds the four lateral edges L1, L2, L3, L4. Preferably but not exclusively, the first magnetic core 41 is a circular magnetic core, and the first encapsulation layer 31 surrounds at least more than half of the lateral periphery L0 of the first magnetic core 41. Certainly, the present disclosure is not limited thereto. In the embodiment, the lateral periphery L0' of the second magnetic core 42 includes four lateral edges L1', L2', L3', L4', and the second encapsulation layer 32 surrounds the three lateral edges L1', L2', L3', as shown in FIG. 4B. Preferably but not exclusively, in another embodiment, the second encapsulation layer 32 surrounds the two lateral edges L1', L2'. In other embodiment, the second encapsulation layer 32 surrounds the four lateral edges L1', L2', L3', L4'. Preferably but not exclusively, the second magnetic core 42 is a circular magnetic core, and the second encapsulation layer 32 surrounds at least more than half of the lateral periphery L0' of the second magnetic core 42. Certainly, the ratios of the lateral periphery L0 and the lateral periphery L0' of the magnetic component 40 surrounded by the encapsulation layer 30 are adjustable according to the practical requirements. By misaligning the positions of the magnetic component 40 and the encapsulation layer 30 and forming the gap G1 and the gap G2, an optimized and stable structural assembly is obtained for the power module 1, and the performance change of the magnetic component 40 due to the stress generated from the encapsulation layer 30 is avoided.

In the embodiment, the power module 1 further includes a copper block 51. Preferably but not exclusively, the copper block 51 is disposed on the first electronic component 21 on the first surface 11. Moreover, the copper block 51 and the first electronic component 21 are embedded in the first encapsulation layer 31 through the same molding process. In the embodiment, the copper block 51 is exposed to an exterior of the first encapsulation layer 31. In another embodiment, the copper block 51 is covered by the encapsulation material completely. Preferably but not exclusively, the copper block 51 and the first electronic component 21 are connected through a thermal conductive glue, a thermal conductive sheet or a solder paste welding, so as to reduce the thermal resistance and further improve the performance of the power module 1. In the embodiment, the power module 1 includes a copper block 52, which is disposed on the first surface 11 of the substrate 10 directly by soldering or other connection ways, and embedded in the first encapsulation layer 31, so as to enhance the effect of heat dissipation. Preferably but not exclusively, in the embodiment, the copper block 52 is exposed to an exterior of the first encapsulation layer 31. In another embodiment, the copper block 52 is covered by the encapsulation material completely. In an embodiment, the copper block 51 and the copper block 52 mentioned above are formed by a grinding process to form a heat dissipation surface exposed to the exterior of the first encapsulation layer 31, but the present disclosure is not limited thereto. Moreover, in the embodiment, the power module 1 further includes a copper block 53, which is directly disposed on the second surface 12 of the substrate 10, embedded in the second encapsulation layer 32, and exposed to an exterior of the second encapsulation layer 32, so that an input pin or an output pin of the power module 1 is formed. In addition, the power module 1 includes a signal connector 54, which is disposed on the second surface 12 of the substrate 10, and embedded in the second encapsulation layer 32. The terminal of the signal connector 54 is exposed to the exterior of the second encapsulation layer 32 to provide a signal transmission function. Certainly, the present disclosure is not limited thereto.

In the embodiment, after the encapsulation layer 30 encapsulates the electronic component 20 on the substrate 10, the first magnetic core 41 and the second magnetic core 42 are connected and fastened to the substrate 10 through the perforation 13. Preferably but not exclusively, the connection method between the first magnetic core 41 and the second magnetic core 42 is realized by such as soldering, glue bonding or gasket bonding. The present disclosure is not limited thereto.

Figure 5:
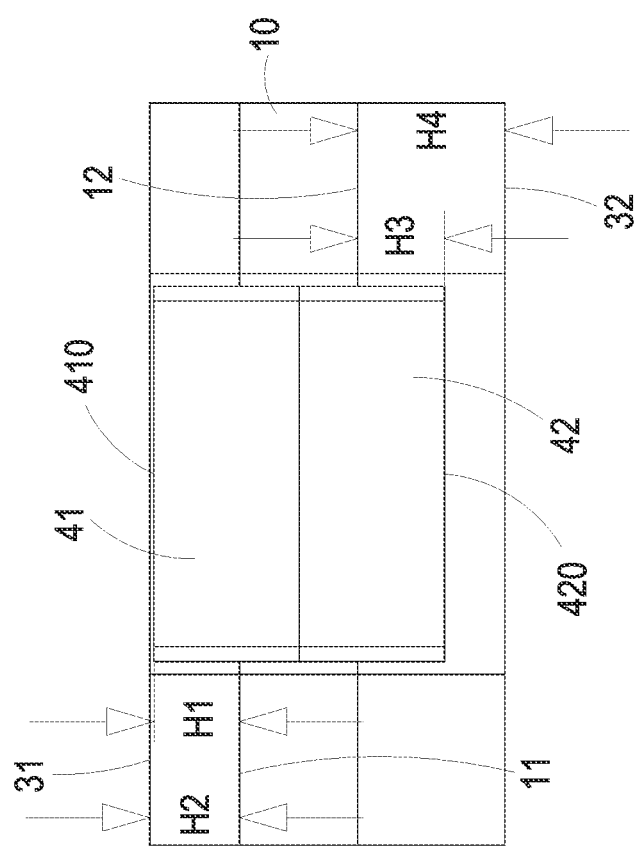
FIG. 5 is a lateral view illustrating the power module according to the first embodiment of the present disclosure.

FIG. 5 is a lateral view illustrating the power module according to the first embodiment of the present disclosure. Please refer to FIGS. 3 and 5. In the embodiment, the first electronic component 21, the copper block 51 and the copper block 52 are disposed on the first surface 11 of the substrate 10, and the first encapsulation layer 31 covers the first electronic component 21, the copper block 51 and the copper block 52. The first encapsulation layer 31 and the first magnetic core 41 of the magnetic component 40 cover the first surface 11 of the substrate 10, respectively. In the embodiment, a height H1 of the first magnetic core 41 of the magnetic component 40 on the first surface 11 is less than or equal to a height H2 of the first encapsulation layer 31 on the first surface 11. In that, the top surface 410 of the first magnetic core 41 is further recessed from the surface of the first encapsulation layer 31 or coplanar with the surface of the first encapsulation layer 31. Therefore, the first encapsulation layer 31 further provides the function of protecting the first magnetic core 41 of the magnetic component 40 in mechanical structure. Moreover, in the embodiment, the second electronic component 22, the copper block 53 and the signal connector 54 are disposed on the second surface 12 of the substrate 10, and the second encapsulation layer 32 covers the second electronic component 22, the copper block 53 and the signal connector 54. The second encapsulation layer 32 and the second magnetic core 42 of the magnetic component 40 cover the second surface 12 of the substrate 10, respectively. In the embodiment, a height H3 of the second magnetic core 42 of the magnetic component 40 on the second surface 12 is less than or equal to a height H4 of the second encapsulation layer 32 on the second surface 12. In that, the bottom surface 420 of the second magnetic core 42 is recessed from the surface of the second encapsulation layer 32 or coplanar with the surface of the second encapsulation layer 32. Therefore, the second encapsulation layer 32 further provides the function of protecting the second magnetic core 42 of the magnetic component 40 in mechanical structure.

Figure 6A:
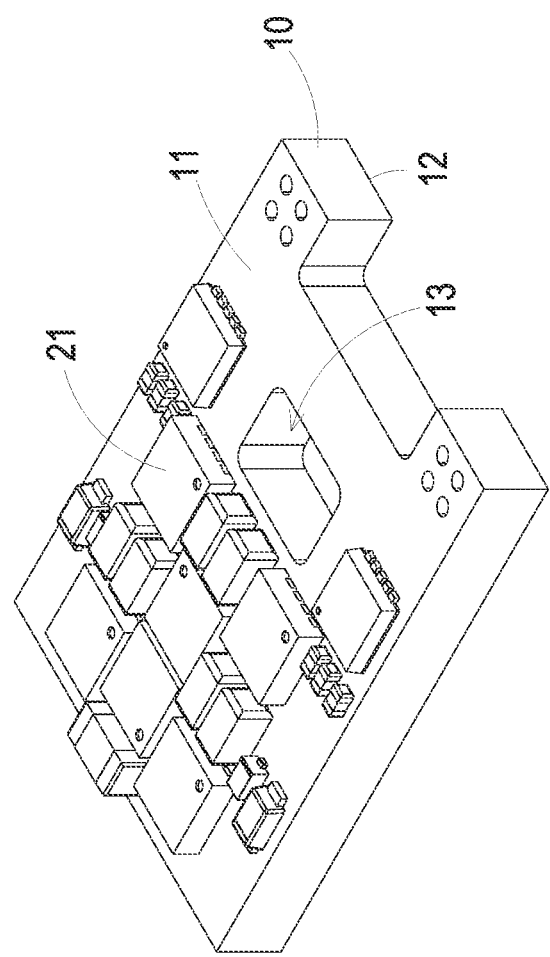
FIGS. 6A to 6E show a manufacturing process of the power module according to the first embodiment of the present disclosure.
Figure 6B:
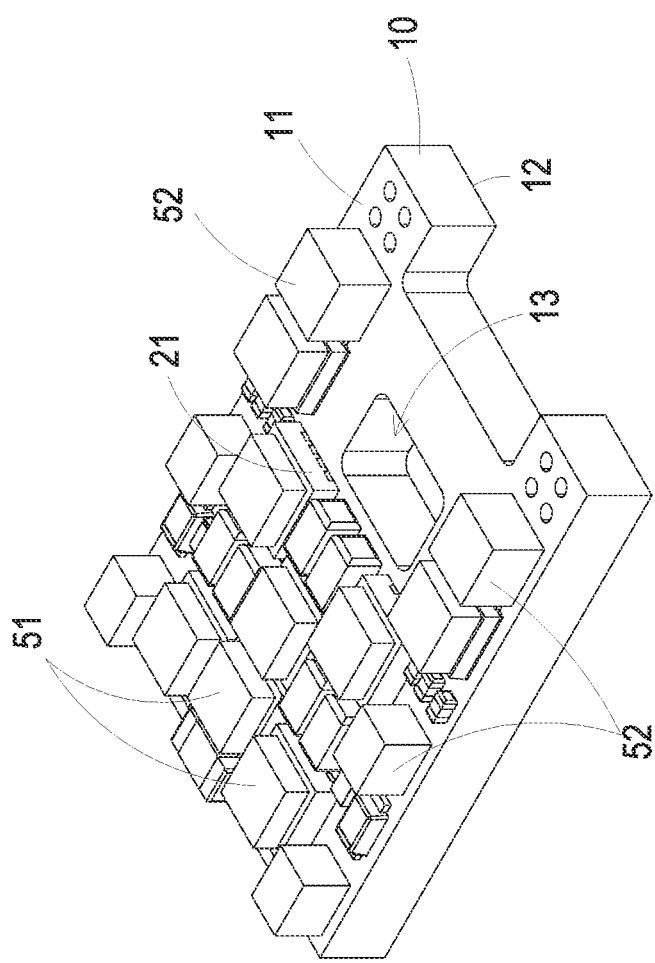
Figure 6C:
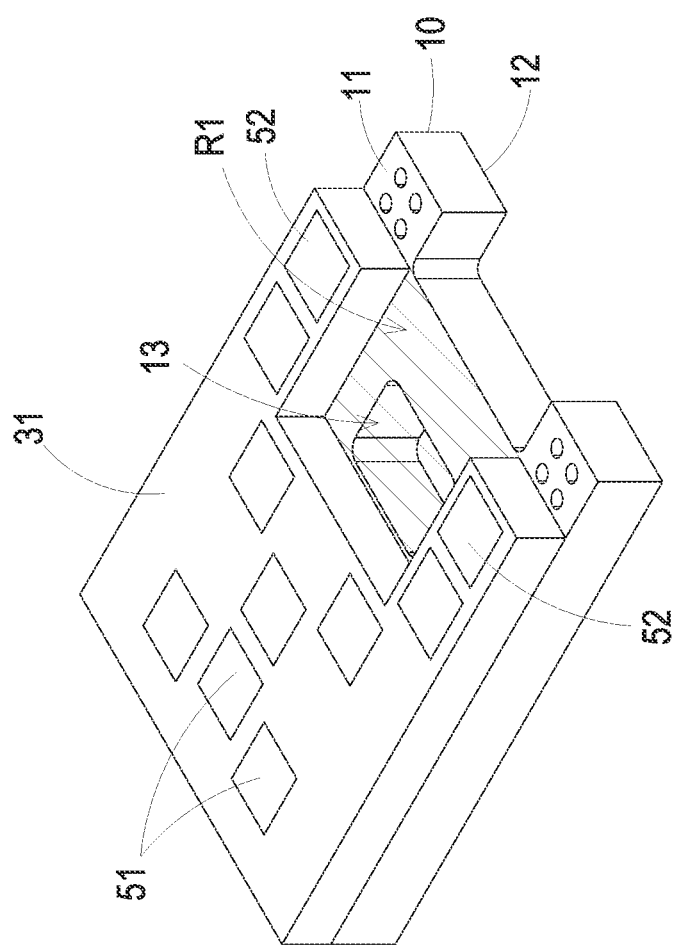
Figure 6D:
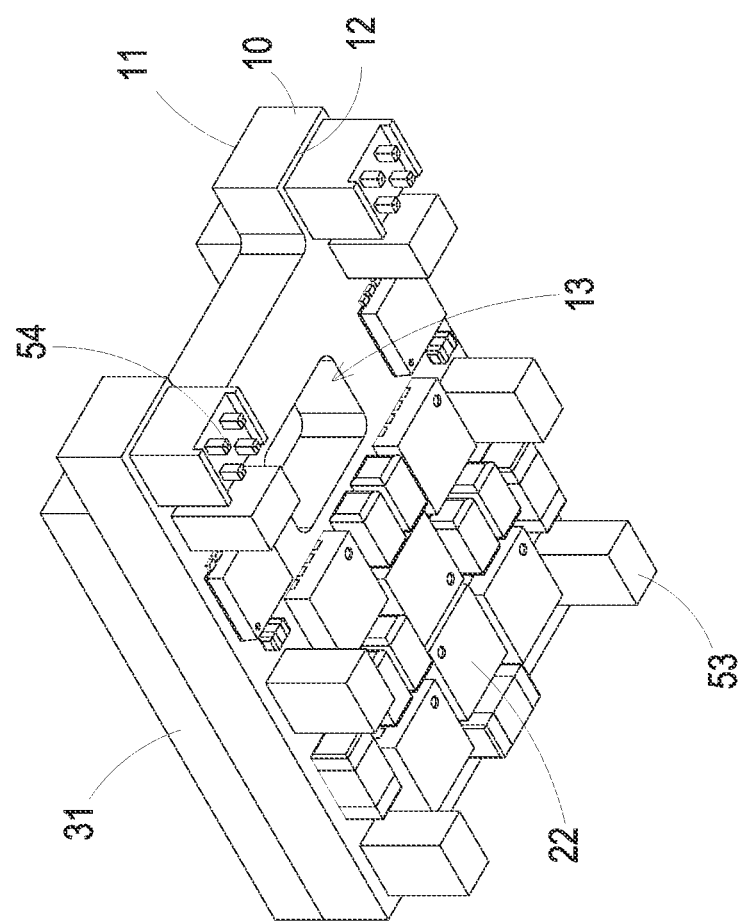
Figure 6E:
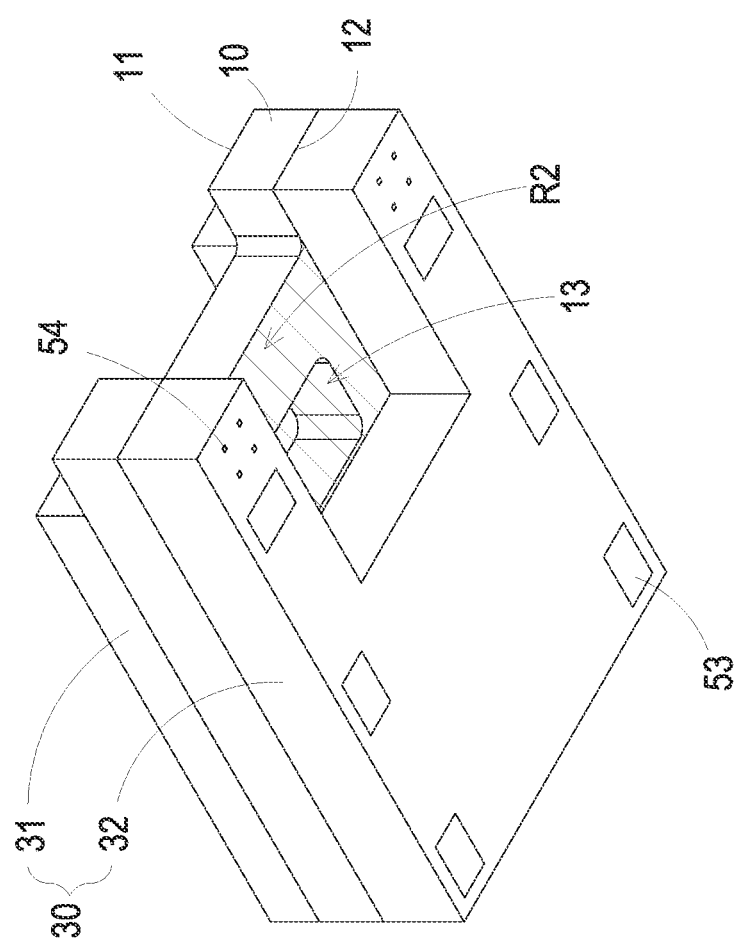
Figure 7A:
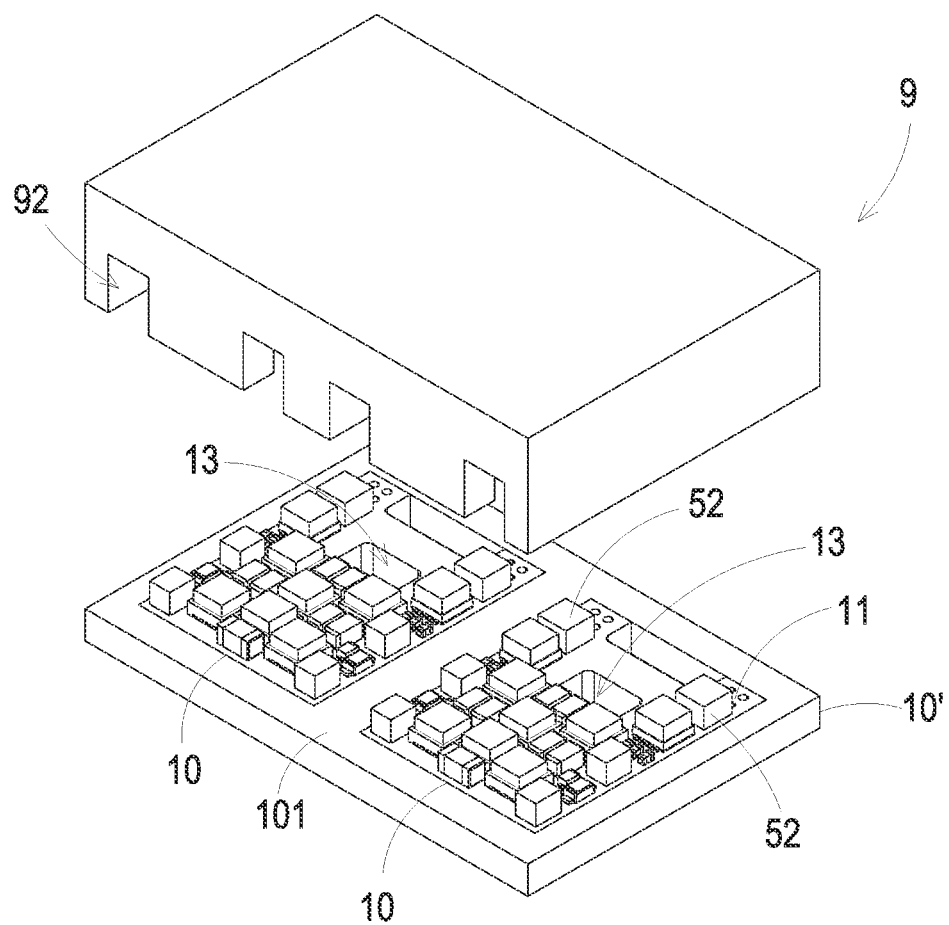
FIG. 7A is a schematic diagram illustrating a panel with two substrates corresponding to a first encapsulation mould according to an embodiment of the present disclosure.
Figure 7B:
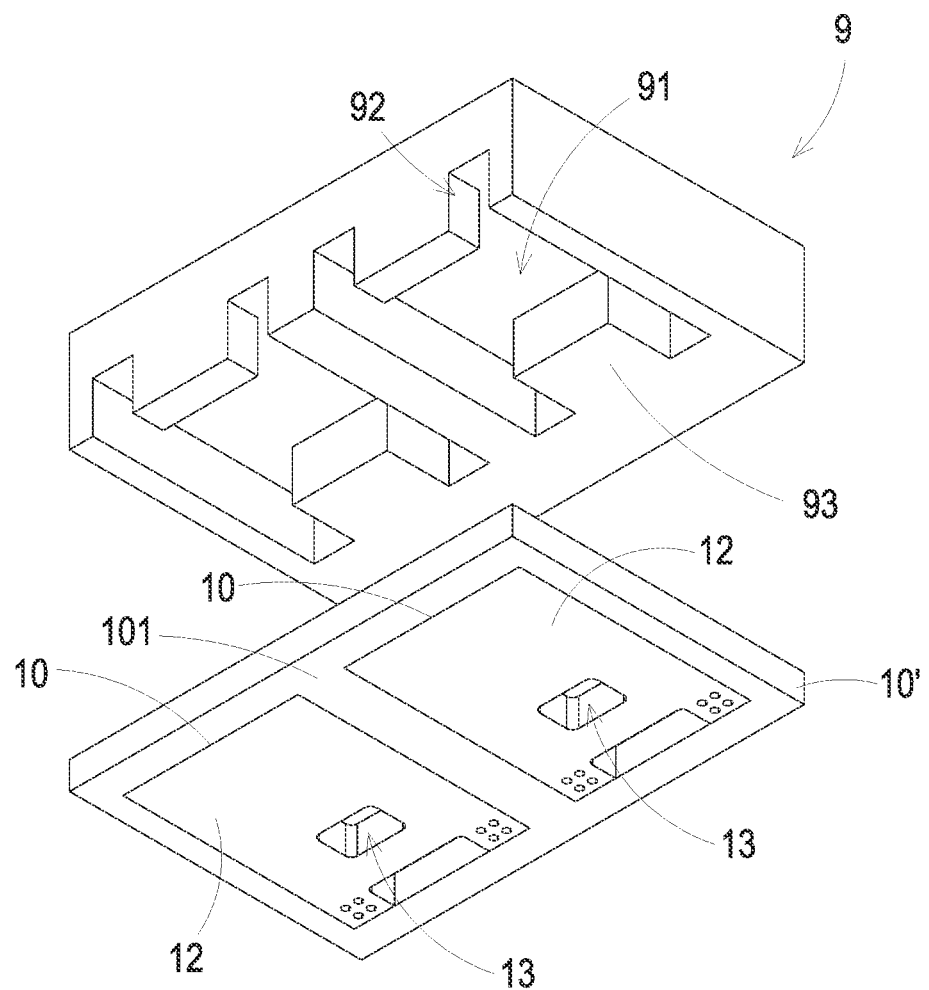
FIG. 7B is a schematic diagram illustrating the panel with the two substrates corresponding to the first encapsulation mould according to the embodiment of the present disclosure and taken from another perspective.
Figure 8:
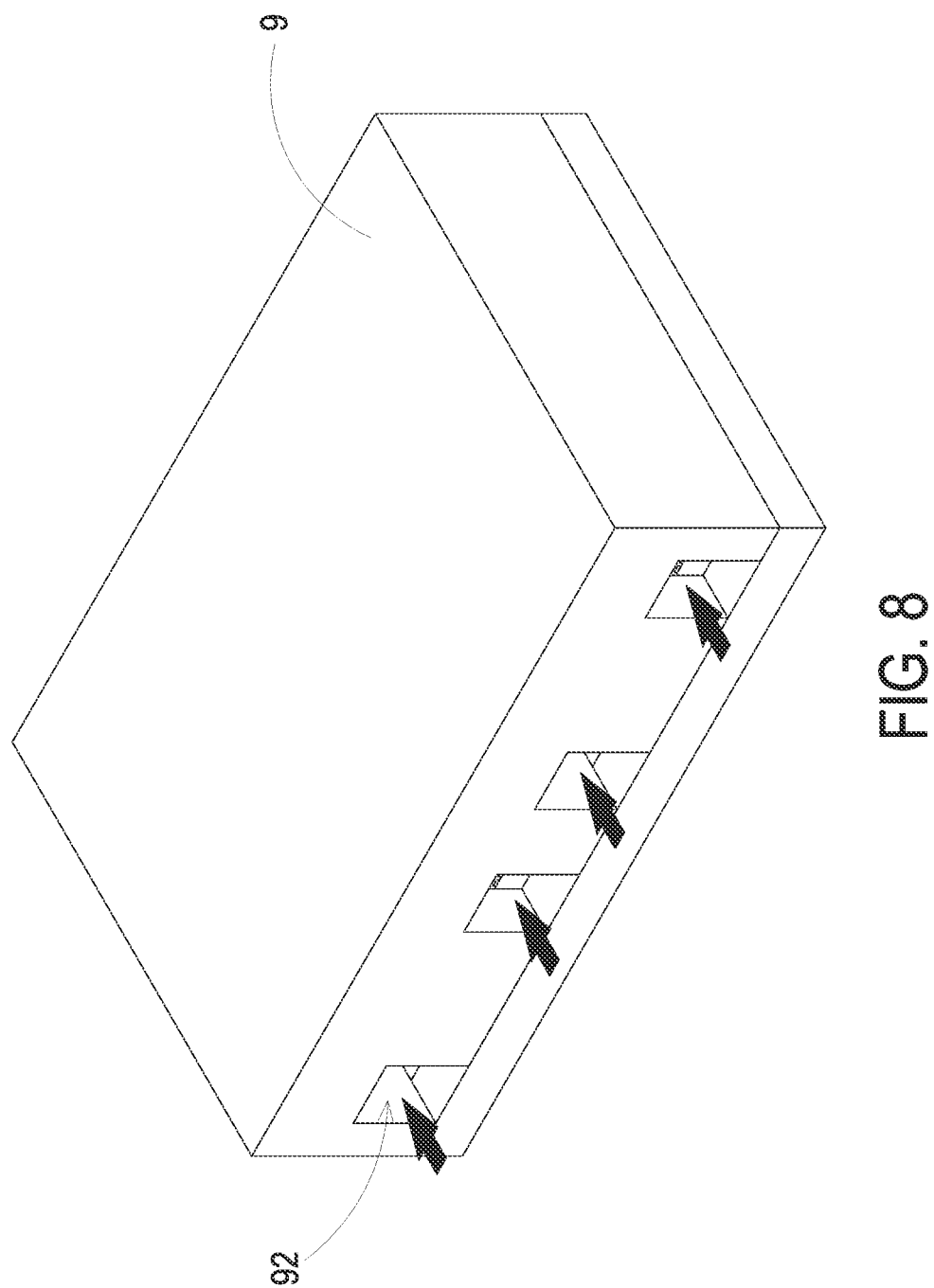
FIG. 8 is a perspective structural view illustrating the panel with the two substrates and the first encapsulation mould combined with each other according to the embodiment of the present disclosure.
Figure 9A:
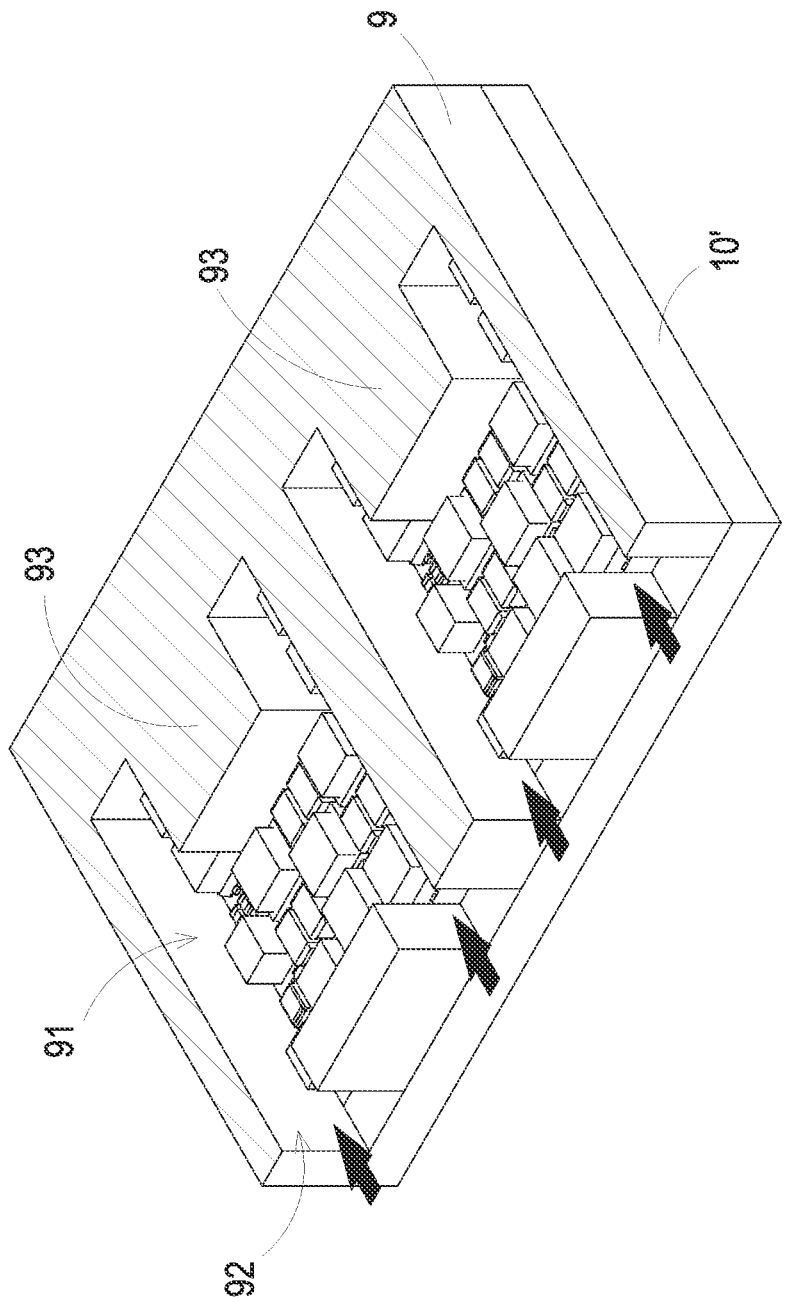
FIG. 9A is a cross-sectional view of FIG. 8.
Figure 9B:
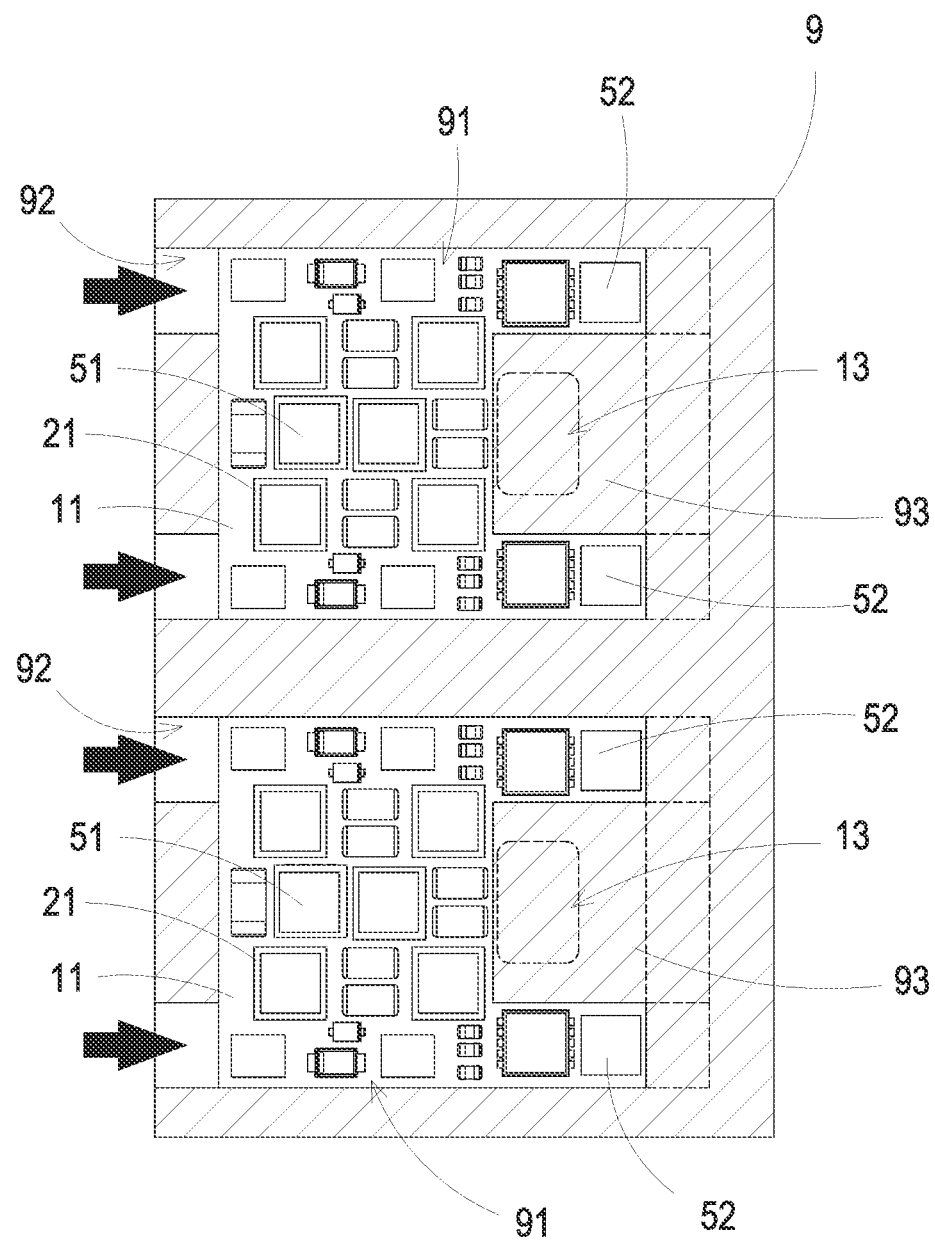
FIG. 9B is a top view of FIG. 9A.
Figure 10A:
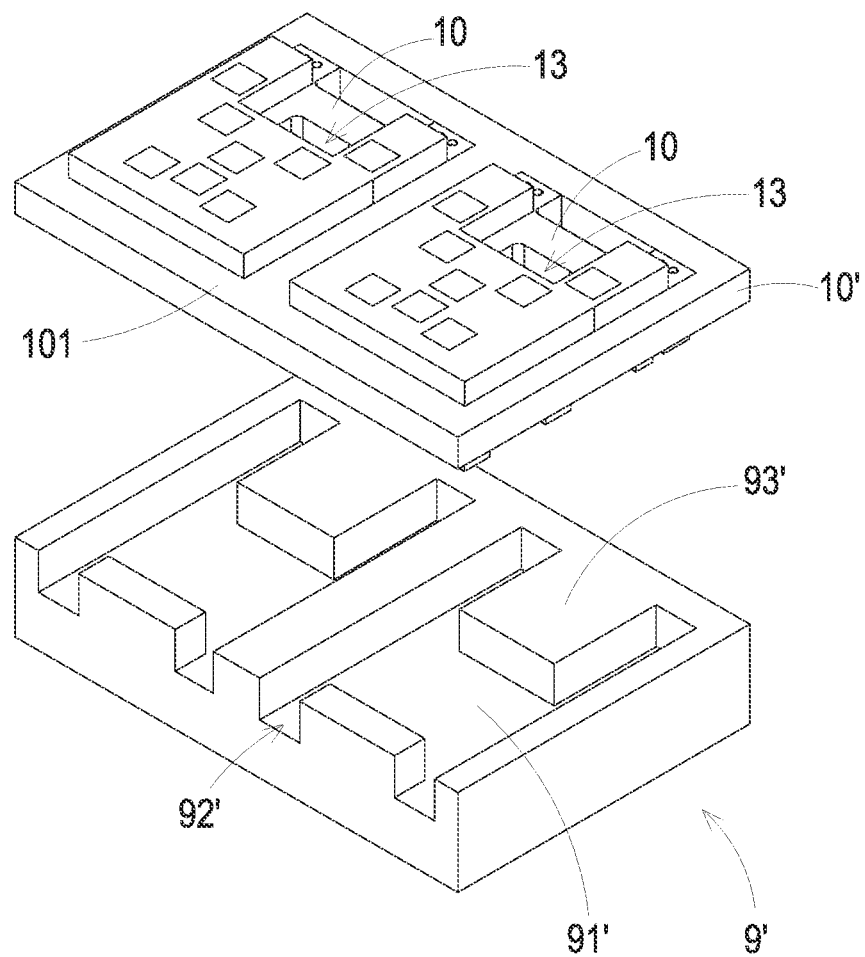
FIG. 10A is a schematic diagram illustrating the panel with the two substrates produced through the first encapsulation mould and corresponding to a second encapsulation mould according to the embodiment of the present disclosure.
Figure 10B:
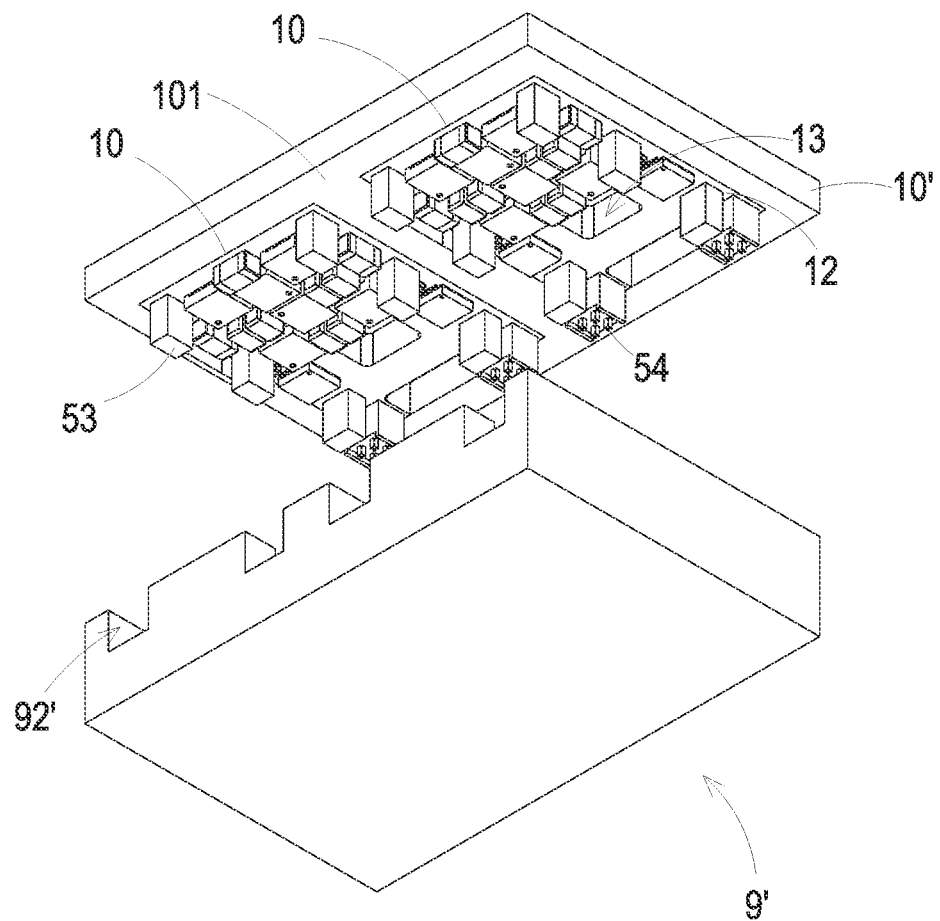
FIG. 10B is a schematic diagram illustrating the panel with the two substrates produced through the first encapsulation mould and corresponding to the second encapsulation mould according to the embodiment of the present disclosure and taken from another perspective.
Figure 11:
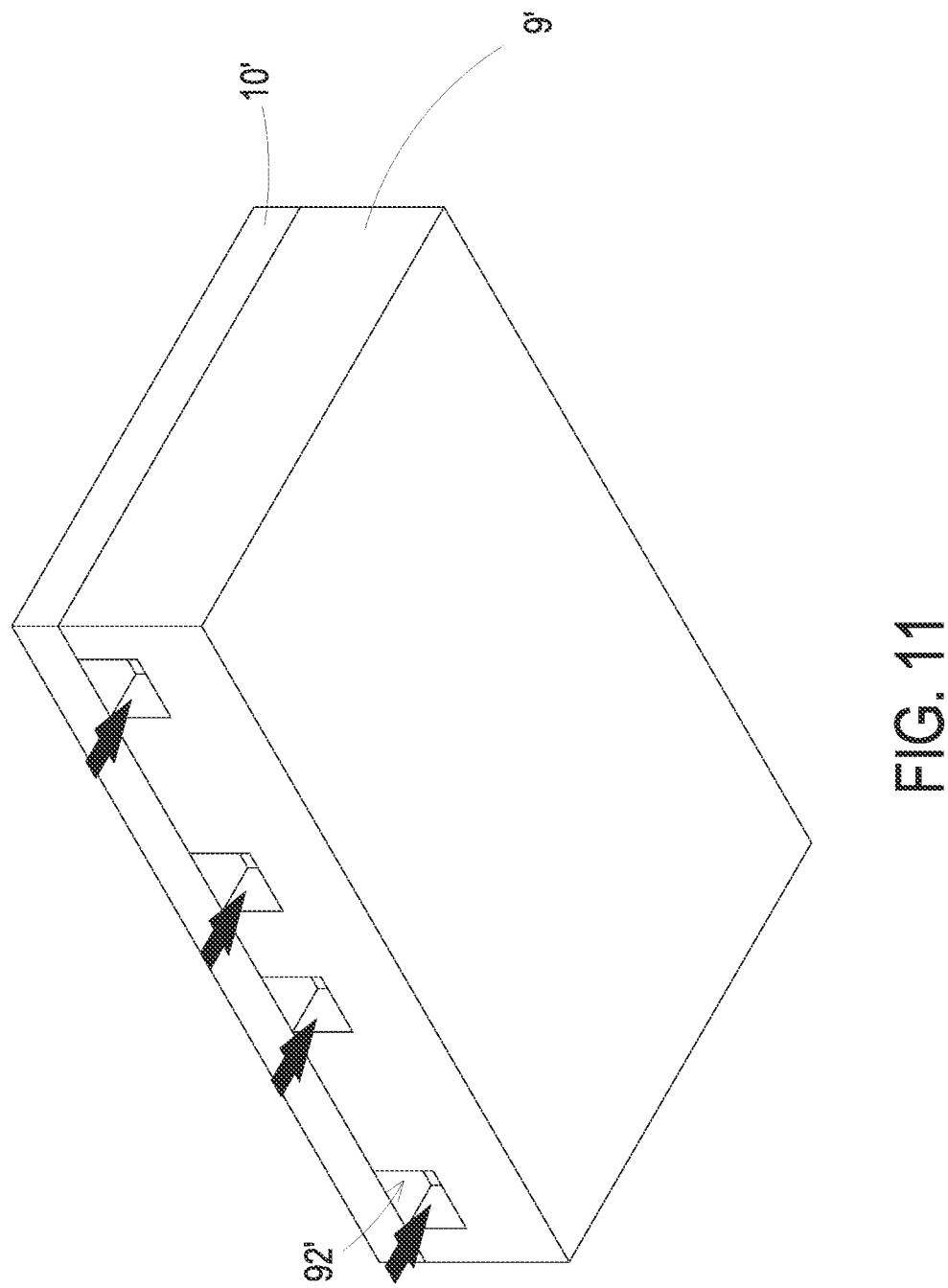
FIG. 11 is a perspective structural view illustrating the panel with the two substrates produced through the first encapsulation mould and combined with the second encapsulation mould according to the embodiment of the present disclosure.
Figure 12A:
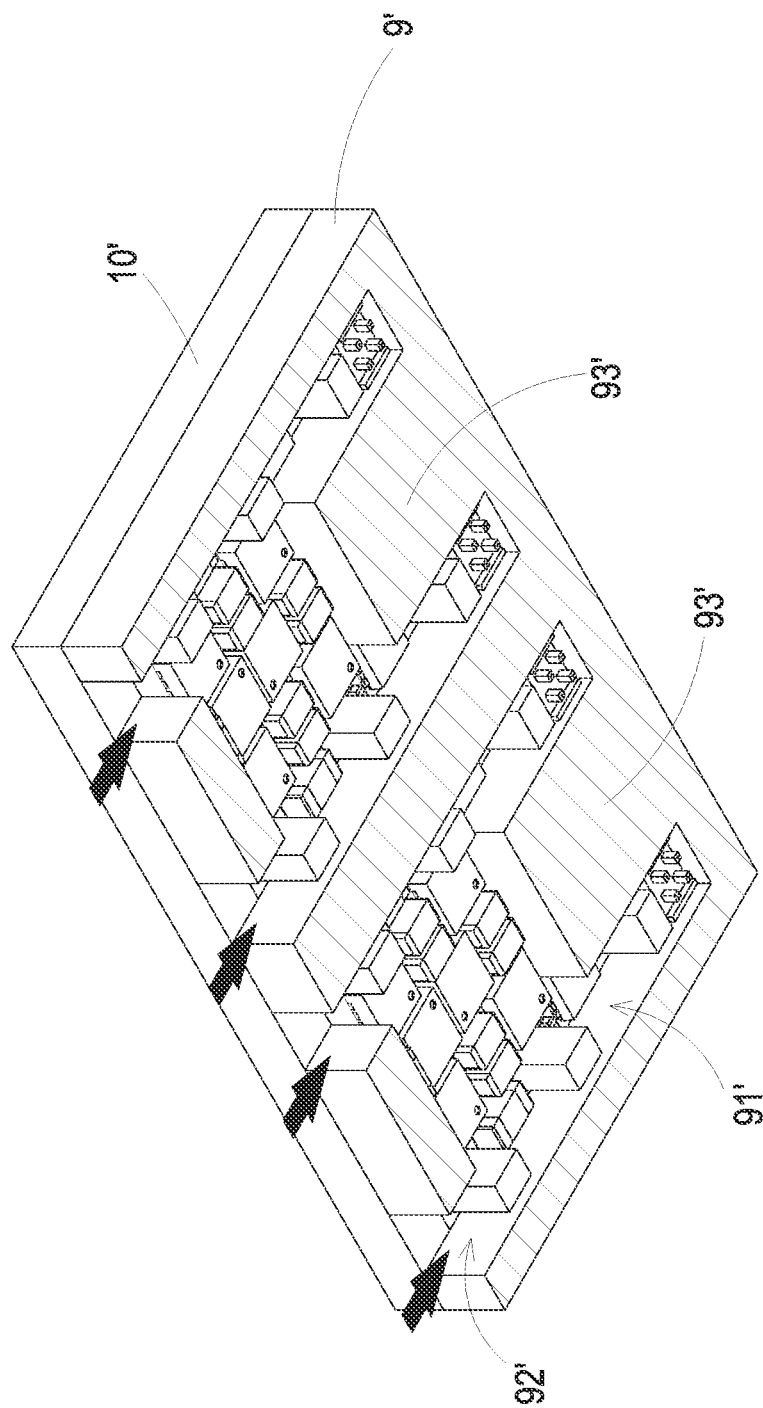
FIG. 12A is a cross-sectional view of FIG. 11.
Figure 12B:
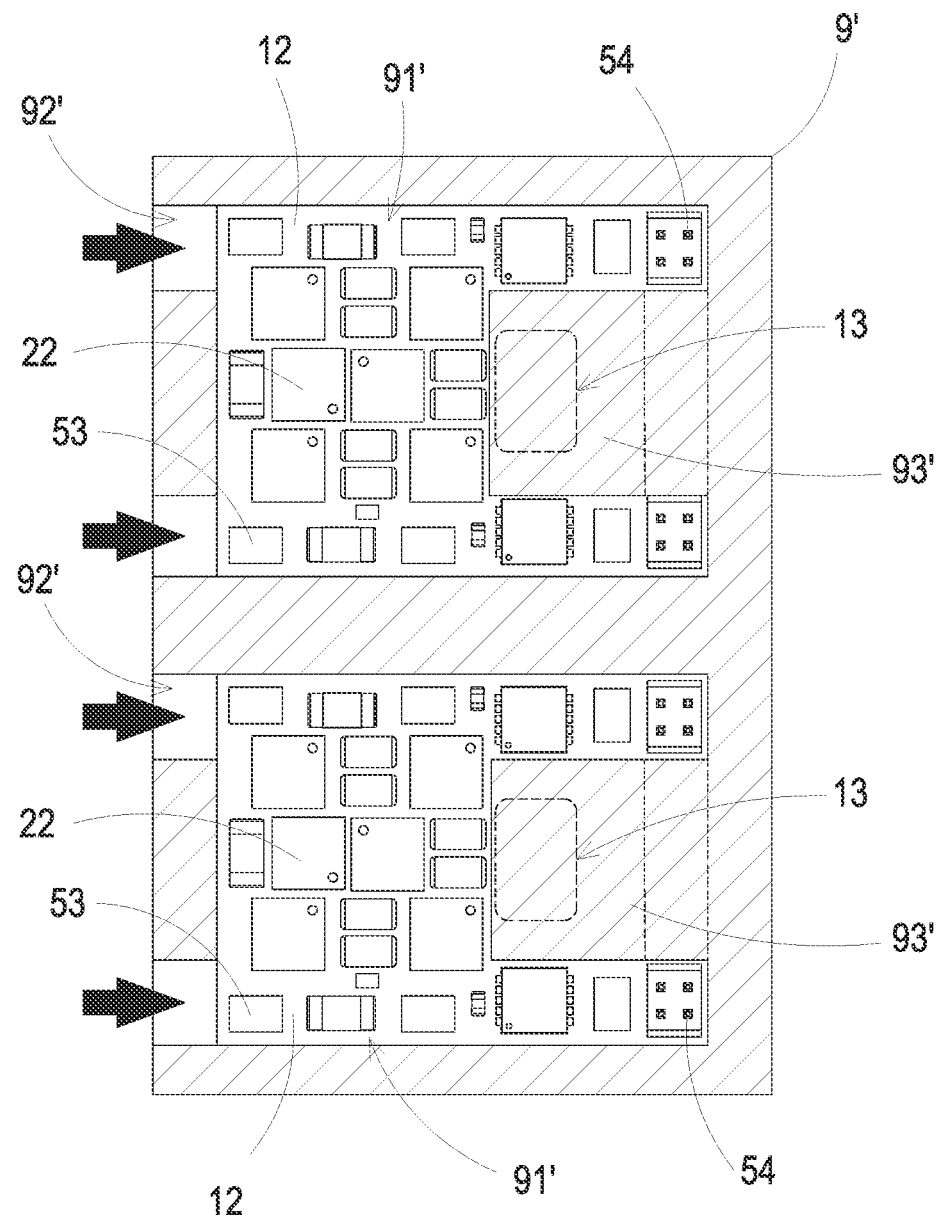
FIG. 12B is a top view of FIG. 12A.

As mentioned above, in order to achieve that the projection of the encapsulation layer 30 and the projection of the magnetic component 40 are misaligned and not overlapped on the first surface 11 of the substrate 10, a manufacturing method of a power module is provided in the present disclosure. FIGS. 6A to 6E show a manufacturing process of the power module according to the first embodiment of the present disclosure. Please refer to FIG. 1A, FIG. 1B, FIGS. 2A to 2B, FIG. 3, FIGS. 4A to 4B and FIGS. 6A to 6E. In the embodiment, a substrate 10 such as a printed circuit board is provided. The substrate 10 includes a first surface 11 and a second surface 12 opposite to each other, and at least one working region. The working region is disposed on the first surface 11 and the second surface 12. In the embodiment, the working region R1 is disposed on the first surface 11, and the working region R2 is disposed on the second surface 12. Thereafter, a first electronic component 21 is disposed on the first surface 11 of the substrate 10. Preferably but not exclusively, in the embodiment, the first electronic component 21 is mounted on the first surface 11 of the substrate 10 by a surface mount method. That is, the solder paste is used to print on the first surface 11 of the substrate 10, then the first electronic component 21 is placed on the set position, and finally the first electronic component 21 is mounted on the first surface 11 of the substrate 10 by reflow soldering, as shown in FIG. 6A. After the first electronic component 21 is mounted, the substrate 10 is subjected to such as cleaning or a surface treatment by the plasma. The present disclosure is not limited thereto. Preferably but not exclusively, a copper block 51 is connected to and disposed on the first electronic component 21 through a thermal conductive glue, a thermal conductive sheet or a solder paste welding, or the copper block 52 is disposed on the first surface 11 of the substrate 10 directly, so as to enhance the effect of heat dissipation for the power module 1, as shown in FIG. 6B. Then, a first encapsulation layer 31 is formed on the first surface 11 of the substrate 10 by a molding process, so as to cover the first electronic components 21, the copper blocks 51 and the copper blocks 52, as shown in FIG. 6C. Notably, the first encapsulation layer 31 is disposed on the first surface 11 of the substrate 10 and has a projection on the first surface 11, which is not overlapped with the projection of the working region R1 on the first surface 11, so that the working region R1 is exposed on the first surface 11 of the substrate 10. In the embodiment, a second electronic component 22 is mounted on the second surface 12 of the substrate 10 by a surface mount method. At the same time, a copper block 53 and a signal connector 54 are disposed on the second surface 12 of the substrate 10, as shown in FIG. 6D. Finally, a second encapsulation layer 32 is formed on the second surface 12 of the substrate 10 by a molding process, so as to cover the second electronic components 22, the copper blocks 53 and the signal connectors 54, as shown in FIG. 6E. Notably, the second encapsulation layer 32 is disposed on the second surface 12 of the substrate 10 and has a projection on the first surface 11, which is not overlapped with the projection of the working region R2 on the first surface 11, so that the working region R2 is exposed on the second surface 12 of the substrate 10. In the embodiment, at least one perforation 13 is disposed on the substrate 10. The at least one perforation 13 is located in the working region R1 and the working region R2. The first magnetic core 41 and the second magnetic core 42 are connected and fastened to the substrate 10 through the perforation 13. In that, the manufacturing process of the power module 1 is completed, and the structure of the power module 1 is obtained, as shown in FIGS. 2A to 2B and FIG. 3. Certainly, the shape and the number of the perforations 13 are related to the types of the first magnetic core 41 and the second magnetic core 42, but the present disclosure is not limited thereto. Notably, after the magnetic component 40 is disposed on the substrate 10, the first encapsulation layer 31 at least partially surrounds the lateral periphery L0 of the first magnetic core 41 of the magnetic component 40. Moreover, a gap G1 is formed between the first encapsulation layer 31 and the lateral periphery L0 of the first magnetic core 41. The gap G1 has a minimum gap distance g1. Preferably but not exclusively, the minimum gap distance g1 is greater than or equal to 0.2 mm. In addition, the second encapsulation layer 32 at least partially surrounds the lateral periphery L0' of the second magnetic core 42 of the magnetic component 40. Moreover, a gap G2 is formed between the second encapsulation layer 32 and the lateral periphery L0' of the second magnetic core 42. The gap G2 has a minimum gap distance g2. Preferably but not exclusively, the minimum gap distance g2 is greater than or equal to 0.2 mm. Since the gap G1 and the gap G2 formed between the encapsulation layer 30 and the magnetic component 40 are greater than or equal to 0.2 mm, it effectively prevents the increase of loss of the magnetic component 40 caused by the stress from the encapsulation layer 30.

Preferably but not exclusively, in another embodiment, the first encapsulation layer 31 and the second encapsulation layer 32 of the encapsulation layer 30 are formed by a double-side synchronous molding method. That is, the first electronic component 21 is fixed on the first surface 11 of the substrate 10, and a copper block 51 is disposed on the first electronic component 21 through the thermal conductive glue, the thermal conductive sheet or the solder paste soldering. Alternatively, the copper block 52 is disposed on the first surface 11 of the substrate 10, directly. Similarly, the second electronic component 22 is fixed on the second surface 12 of the substrate 10, and the copper block 53 and the signal connector 54 are disposed on the second surface 12 of the substrate 10. Then, the first encapsulation layer 31 is formed on the first surface 11 of the substrate 10, and the second encapsulation layer 32 is formed on the second surface 12 of the substrate 10 through a molding process simultaneously. In that, the first encapsulation layer 31 covers the first electronic component 21, the copper block 51 and the copper block 52, and the second encapsulation layer 32 covers the second electronic component 22, the copper block 53 and the signal connector 54. Except for this, the other features are the same as those in the previous embodiment, and are not redundantly described herein.

On the other hand, in another embodiment, the aforementioned power module 1 is produced in the form of a panel for the molding process. FIGS. 7A to 7B, FIG. 8, FIGS. 9A to 9B, FIGS. 10A to 10B, FIG. 11 and FIGS. 12A to 12B show a manufacturing process of the power module according to an embodiment of the present disclosure, and two power modules are taken as an example therein. Notably, in the embodiment, two power modules are taken as an example to illustrate the manufacturing process with the panel structure, but the present disclosure is not limited thereto. Moreover, in an embodiment, a plurality of substrates 10 are combined to form a panel 10' through the connecting portion 101. In another embodiment, a single panel 10' is encapsulated and then the connecting portion 101 is cut and removed to form a plurality of substrates 10. The present disclosure is not limited thereto. In other embodiments, the plurality of power modules 1 are combined to form the panel structure of m rows and n columns (m≥2, n≥1). The arrangements of the plurality of power modules 1 are adjustable, and the present disclosure is not limited thereto. Please refer to FIGS. 1A to 1B, FIGS. 2A to 2B, FIG. 3, FIGS. 4A to 4B and FIGS. 7A to 7B. In the embodiment, a plurality of first electronic component 21, a plurality of copper blocks 51 and a plurality of copper blocks 52 are disposed on the corresponding first surfaces 11 of the substrates 10, respectively, and form an array arrangement on the corresponding first surfaces 11. Then, a first encapsulation mould 9 is pressed on the first surfaces 11 of the panel 10', and a first molding process is performed. Notably, the first encapsulation mould 9 includes a plurality of encapsulation spaces 91 and a plurality of openings 92. The plurality of openings 92 are in communication with the corresponding encapsulation space 91. The plurality of encapsulation spaces 91 spatially correspond to the first surfaces 11 of the plurality of substrates 10, respectively. Preferably but not exclusively, the encapsulation material such as the epoxy resin is flowing through the corresponding openings 92 to form a plurality of first encapsulation layers 31, respectively. In that, the first electronic components 21, the copper blocks 51 and the copper blocks 52 are covered by the corresponding first encapsulation layers 31. In the embodiment, the first encapsulation mould 9 further includes a plurality of protruding blocks 93, protruded inwardly to the corresponding encapsulation spaces 91. When the plurality of substrates 10 are combined with the first encapsulation mould 9, each protruding block 93 is configured to cover the working region R1 on the first surface 11 of the corresponding substrate 10 (Referring to FIG. 6C), so as to occupy the position for the first magnetic core 41 of the magnetic component 40 in the subsequent assembling process. Therefore, when the encapsulation material such as the epoxy resin is filled into the encapsulation spaces 91 through the openings 92, each protruding block 93 is used to prevent the encapsulation material from filling or occupying the position for the first magnetic core 41 of the magnetic component 40 in the subsequent assembling process. In other words, by optimizing the design of the first encapsulation mould 9 of the present disclosure, the plurality of first encapsulation layers 31 are formed in the first molding process, so as to cover the first electronic components 21, the copper blocks 51 and the copper blocks 52 on the first surface 11 of the corresponding substrate 10, respectively. Moreover, the projections of the plurality of first encapsulation layers 31 on the first surfaces 11 are not overlapped with the projections of the corresponding working regions R1 on the first surfaces 11. That is, misalignments are formed to expose the plurality of working regions R1 on the first surfaces 11 of the corresponding substrates 10.

In the embodiment, after the plurality of first encapsulation layers 31 are formed on the first surfaces 11 of the substrates 10 by the first molding process, a plurality of second electronic components 22 are mounted on the second surfaces 12 of the corresponding substrates 10 on the panel 10' by for example but not limited to a surface mount method. At the same time, a plurality of copper blocks 53 and a plurality of signal connectors 54 are disposed on the second surfaces 12 of the substrates 10. In the embodiment, a second encapsulation mould 9' is pressed on the second surfaces 12 of the panel 10', and a second molding process is performed. In the embodiment, the second encapsulation mould 9' includes a plurality of encapsulation spaces 91' and a plurality of openings 92'. The plurality of openings 92' are in communication with the corresponding encapsulation space 91'. The plurality of encapsulation spaces 91' spatially correspond to the second surfaces 12 of the plurality of substrates 10, respectively. The encapsulation material such as the epoxy resin is flowing through the corresponding openings 92' to form a plurality of second encapsulation layers 32, respectively. In that, the second electronic components 22, the copper blocks 53 and the signal connectors 54 are covered by the corresponding second encapsulation layers 32. In the embodiment, the second encapsulation mould 9' further includes a plurality of protruding blocks 93', protruded inwardly to the corresponding encapsulation spaces 91'. When the plurality of substrates 10 are combined with the second encapsulation mould 9', each protruding block 93' is configured to cover the working region R2 on the second surface 12 of the corresponding substrate 10 (Referring to FIG. 6E), so as to occupy the position for the second magnetic core 42 of the magnetic component 40 in the subsequent assembling process. Therefore, when the encapsulation material such as the epoxy resin is filled into the encapsulation spaces 91' through the openings 92', each protruding block 93' is used to prevent the encapsulation material from filling or occupying the position for the second magnetic core 42 of the magnetic component 40 in the subsequent assembling process. In other words, by optimizing the design of the second encapsulation mould 9' of the present disclosure, the plurality of second encapsulation layers 32 are formed in the second molding process, so as to cover the second electronic components 22, the copper blocks 53 and the signal connectors 54 on the second surfaces 12 of the corresponding substrates 10, respectively. Moreover, the projection of each of the second encapsulation layers 32 on the corresponding first surface 11 is not overlapped with the projection of the working region R2 on the corresponding first surface 11. That is, misalignments are formed to expose the plurality of working regions R2 on the second surfaces 12 of the corresponding substrates 10. In the embodiment, the formation of the working region R1 and the working region R2 on each substrate 10 is achieved by the design of the first encapsulation mould 9 and the second encapsulation mould 9', and the subsequent mechanical processing is not required to remove the encapsulation material. After the molding process, the demolding is carried out, the magnetic components 40 are assembled, and the panel 10' is sawed so as to remove the connecting portion 101. Consequently, a plurality of power modules 1 are obtained. In other embodiments, the panel 10' is sawed to remove the connecting portion 101 and form a plurality of substrates 10. Then, the magnetic components 40 are assembled on the corresponding substrates 10. The present disclosure is not limited thereto.

Similar to the aforementioned process of producing the single power module 1 by the double-side synchronous molding method, in another embodiment, a plurality of first electronic components 21, a plurality of copper blocks 51 and a plurality of copper blocks 52 are disposed on the first surfaces 11 of the corresponding substrates 10, respectively, and a plurality of second electronic components 22, a plurality of copper blocks 53 and a plurality of signal connectors 54 are disposed on the second surfaces 12 of the corresponding substrates 10, respectively. Then, the first encapsulation mould 9 and the second encapsulation mould 9' are pressed and buckled on the panel 10'. One molding process is performed to form a plurality of first encapsulation layer 31 and a plurality of second encapsulation layer 32, simultaneously. In the embodiment, the plurality of first encapsulation layers 31 cover the corresponding first electronic components 21, the corresponding copper blocks 51 and the corresponding copper blocks 52, respectively. The plurality of second encapsulation layers 32 cover the corresponding second electronic components 22, the corresponding copper blocks 53 and the corresponding signal connectors 54. The other steps after the molding process are the same as those in the previous embodiment, and are not redundantly described herein.

In the embodiment, each substrate 10 of the panel 10' includes at least one perforation 13 located in the corresponding working region R1 and the corresponding working region R2. The first magnetic core 41 and the second magnetic core 42 of the magnetic component 40 are disposed in the working region R1 and the working region R2 of the corresponding substrate 10 through at least one perforation 13 of each substrate 10. In that, each first encapsulation layer 31 at least partially surrounds the lateral peripheral edge L0 of the first magnetic core 41 of the corresponding magnetic component 40 (Referring to FIG. 4A). Moreover, a gap G1 is formed between each first encapsulation layer 31 and the lateral periphery L0 of the first magnetic core 41 of the corresponding magnetic component 40. The gap G1 has a minimum gap distance g1. Preferably but not exclusively, the minimum gap distance g1 is greater than or equal to 0.2 mm. In addition, each second encapsulation layer 32 at least partially surrounds the lateral peripheral edge L0' of the second magnetic core 42 of the corresponding magnetic component 40 (Referring to FIG. 4B). Moreover, a gap G2 is formed between each second encapsulation layer 32 and the lateral periphery L0' of the second magnetic core 42 of the corresponding magnetic component 40. The gap G2 has a minimum gap distance g2. Preferably but not exclusively, the minimum gap distance g2 is greater than or equal to 0.2 mm. Since the gap G1 and the gap G2 formed between the encapsulation layer 30 and the corresponding magnetic component 40 are greater than or equal to 0.2 mm, it prevents the increase of the power loss caused by the stress generated between each encapsulation layer 30 and the corresponding magnetic component 40 sufficiently. On the other hand, the plurality of power modules 1 are produced by encapsulating together through the panel and then combining with magnetic components 40 thereon. It is helpful of integrating and simplifying the manufacturing process of the power modules 1. Moreover, the purpose of enhancing the structural stability and reducing the manufacturing cost are achieved at the same time.

Figure 13:
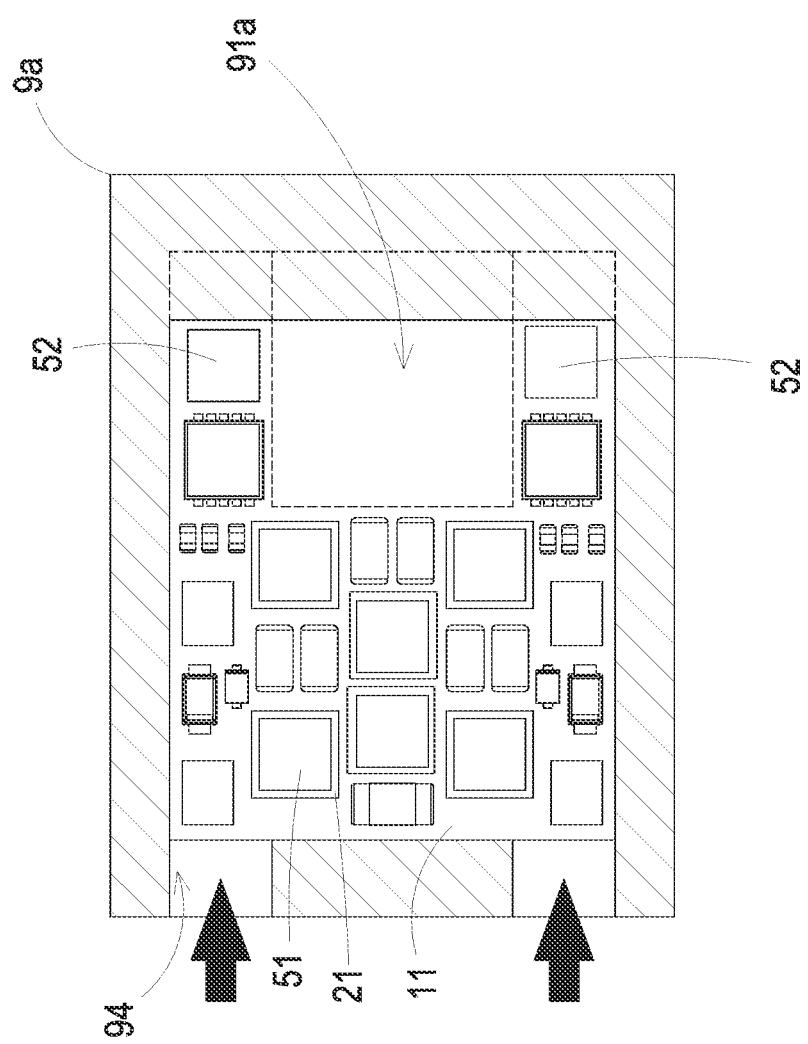
FIG. 13 is a schematic diagram illustrating the substrate combined with a third encapsulation mould according to an embodiment of the present disclosure.
Figure 14:
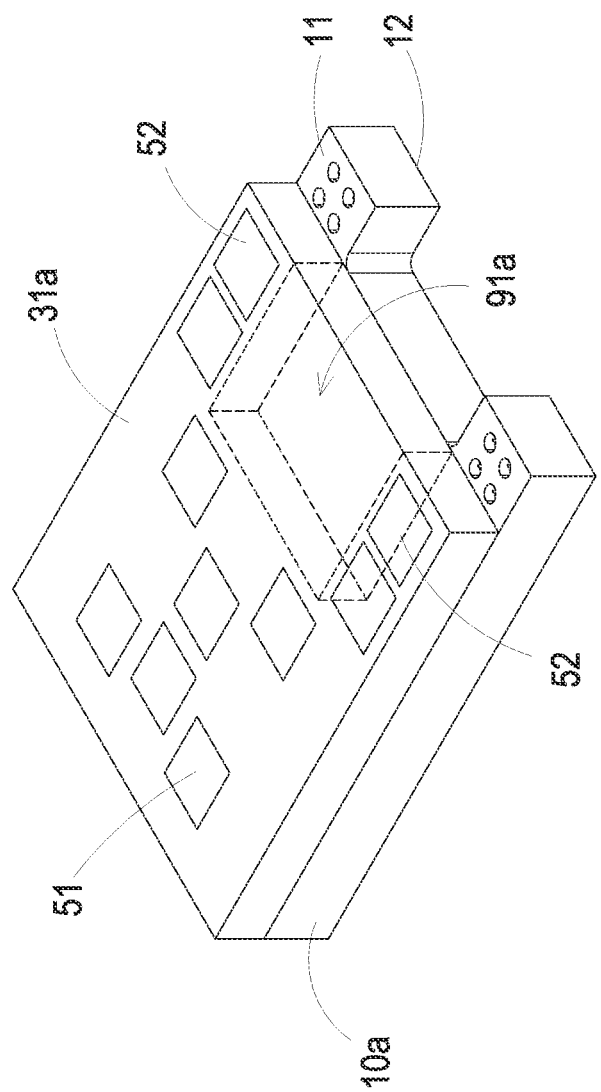
FIG. 14 is a perspective structural view illustrating an encapsulation material layer formed on the substrate by utilizing the third encapsulation mould of FIG. 13.
Figure 15:
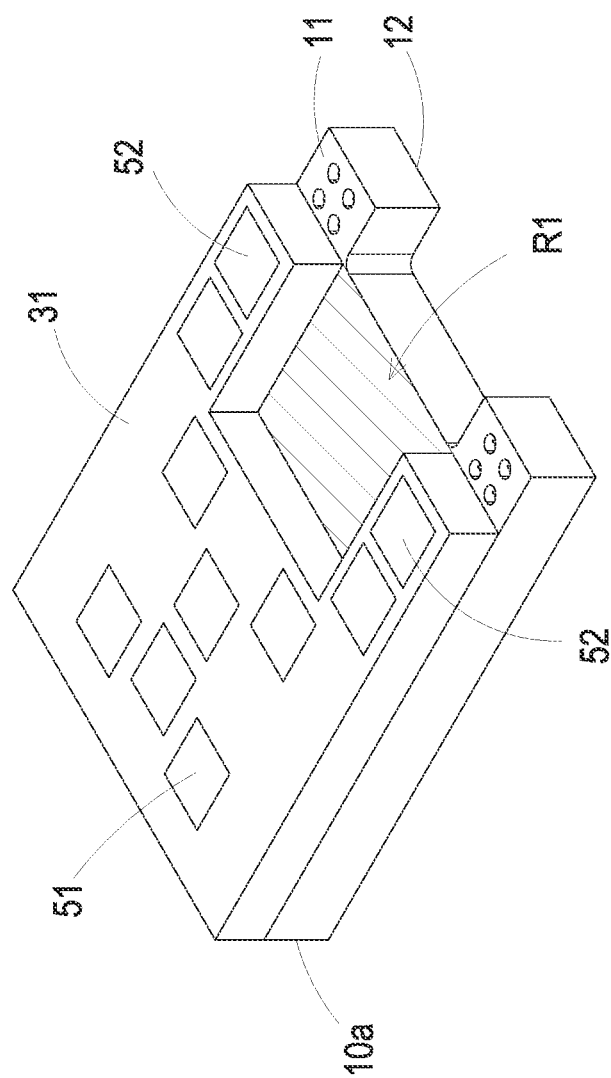
FIG. 15 is a perspective structural view illustrating that the encapsulation material layer of FIG. 14 is partially removed to expose the working region.

FIG. 13 is a schematic diagram illustrating the substrate combined with a third encapsulation mould according to an embodiment of the present disclosure. In the embodiment, the structures, elements and functions of the third encapsulation mould 9a and the substrate 10a are similar to those of the first encapsulation mould 9 and the substrate 10 in FIGS. 7A to 7B, FIG. 8 and FIGS. 9A to 9B, and are not redundantly described herein. In the embodiment, the structure of the protruding block 93 in the first encapsulation mould 9 is omitted in the third encapsulation mould 9a, and the substrate 10a does not have the perforation. Preferably but not exclusively, in the embodiment, the encapsulation space 91a of the third encapsulation mould 9a for the assembling position of the magnetic component 40 is a chamber, and there is no block in the chamber of the third encapsulation mould 9a. In the embodiment, by utilizing the third encapsulation mould 9a (Referring to FIG. 13), an encapsulation material layer 31a is formed on the first surface 11 of the substrate 10a, as shown in FIG. 14. Preferably but not exclusively, the encapsulation material layer 31a directly covers the encapsulation space 91a originally configured to install a magnetic component 40 on the first surface 11. In an embodiment, a part of the encapsulation material layer 31a corresponding to the encapsulation space 91a on the first surface 11 of the substrate 10a in the previous embodiment is removed by for example but not limited to a mechanical processing, to form the first encapsulation layer 31 shown in FIG. 15, and the working region R1 is exposed for the installation of magnetic component 40 (such as transformer). In an embodiment, a perforation 13a is formed in the working region R1 of the substrate 10a by for example but not limited to a mechanical processing method, so as to obtain the structure shown in FIG. 6C. In other words, the perforation 13 on the substrate 10a can be formed by the mechanical processing method after the molding process. The timing of forming the perforation 13 is not limited in the present disclosure. Therefore, the substrate 10a is not pre-designed to include any perforations or slots required for assembling the magnetic core of the transformer, and the third encapsulation mould 9a is not designed to include any block for avoidance, it simplifies the design of the third encapsulation mould 9a. Furthermore, since there is no structure in the chamber of the third encapsulation mould 9a corresponding to the encapsulation space 91a to block the flow of the encapsulation material, the encapsulation material flows smoothly in the encapsulation space 91a, so that the encapsulation space 91a is filled with the encapsulation material completely and the formation of voids is avoided.

Figure 16:
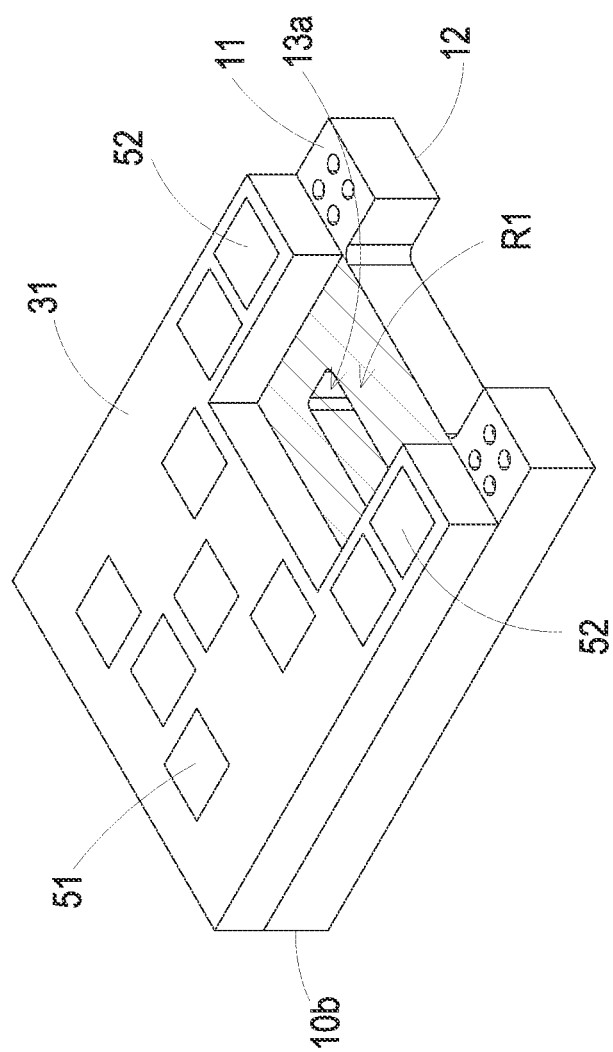
FIG. 16 is a perspective structural view illustrating the power module having an alternative substrate according to another embodiment of the present disclosure.

FIG. 16 is a perspective structural view illustrating the power module having an alternative substrate according to another embodiment of the present disclosure. In the embodiment, the structures, elements and functions of the substrate 10b are similar to those of the substrate 10 in FIGS. 7A to 7B and FIGS. 9A to 9B, and are not redundantly described herein. Please refer to FIGS. 7A to 7B, FIGS. 9A to 9B and FIG. 16. In the embodiment, the substrate 10b includes a small-sized perforation 13a in the working region R1, and the position of the perforation 13a is offset from the boundary between the working region R1 and the first encapsulation layer 31. Therefore, in the molding process, the substrate 10b is tightly pressed by the protruding block 93 of the first encapsulation mould 9 with a larger contact area. It is helpful of preventing the encapsulation material from leaking from the edge of the protruding block 93 and overflowing to the perforation 13a during the molding process. Preferably but not exclusively, in another embodiment, after the manufacturing process of the first encapsulation layer 31 is completed by the molding process, the size of the perforation 13a is increased according to the practical requirements by the mechanical processing, so as to facilitate the subsequent assembling process of the magnetic component 40. Certainly, the present disclosure is not limited thereto.

Figure 17:
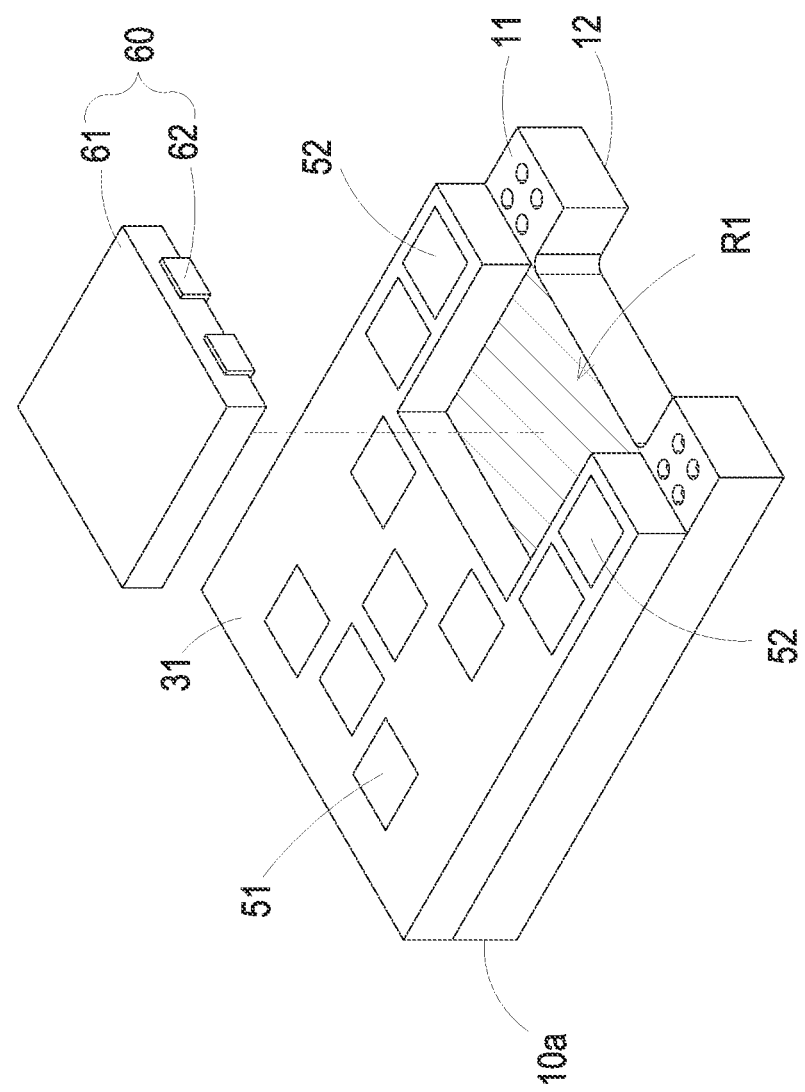
FIG. 17 is an exploded view illustrating a power module according to a second embodiment of the present disclosure.

FIG. 17 is an exploded view illustrating a power module according to a second embodiment of the present disclosure. In the embodiment, the structures, elements and functions of the power module 1a are similar to those of the power module 1 in FIGS. 1A to 5, and are not redundantly described herein. In the embodiment, the substrate 10a includes a pad or a solder hole (not shown) in the working region R1 or the working region R2. In an embodiment, the magnetic component 60 is a discrete magnetic component. Preferably but not exclusively, a winding 62 and a magnetic powder material are integrated to form the discrete magnetic component 60. In another embodiment, a winding 62 is wound on the bobbin and forms the discrete magnetic component 60 with the magnetic core 61. The magnetic component 60 is fixed to the first surface 11 of the substrate 10a through the pad or the solder hole disposed in the working region R1, and is electrically connected to the first electronic component 21. In other embodiments, the magnetic component 60 is fixed to the second surface 12 of the substrate 10a through the pad or the solder hole disposed in the working region R2, and electrically connected to the second electronic component 22.

Figure 18A:
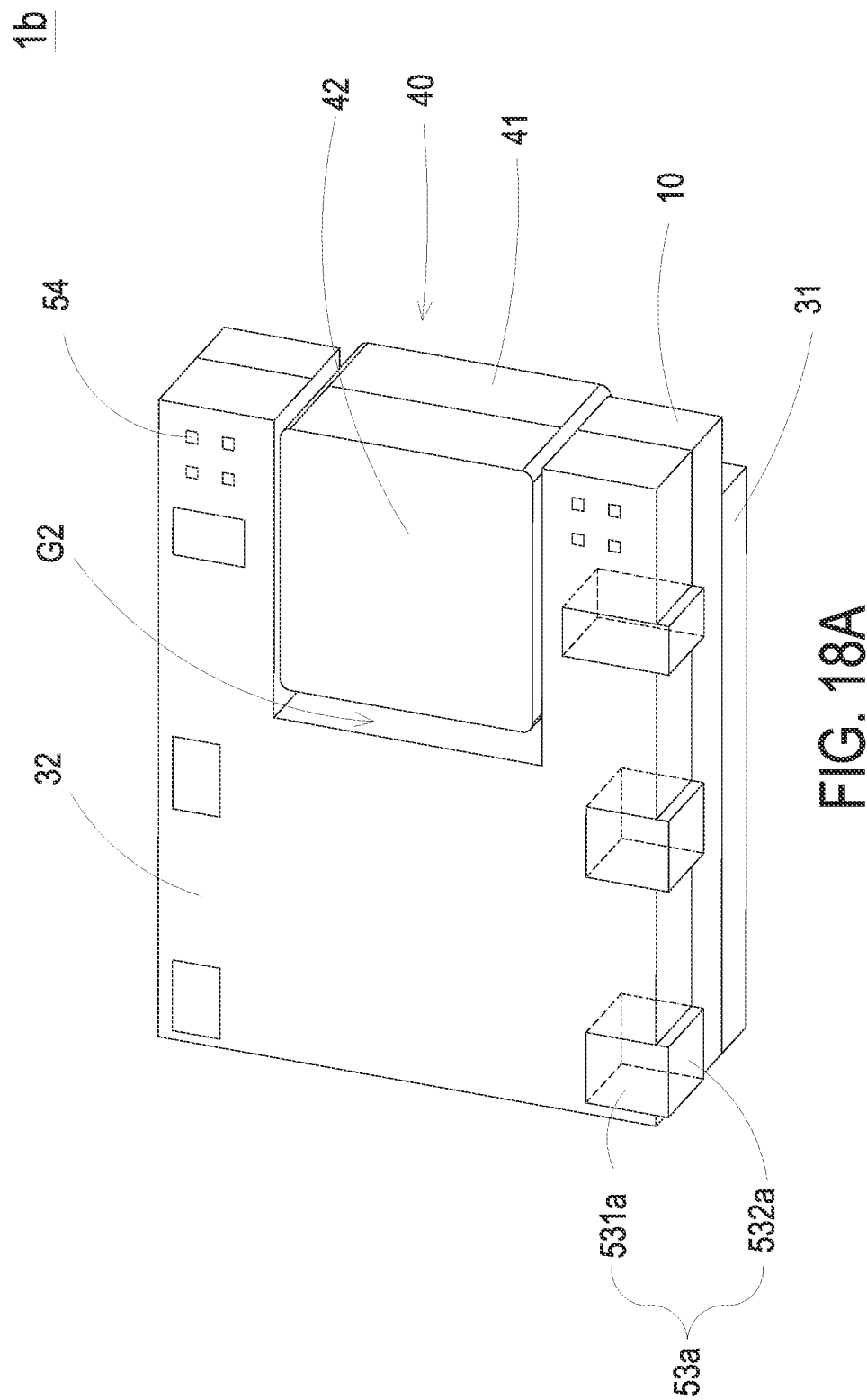
FIG. 18A is a perspective structural view illustrating a power module according to a third embodiment of the present disclosure.

FIG. 18A is a perspective structural view illustrating a power module according to a third embodiment of the present disclosure. In the embodiment, the structures, elements and functions of the power module 1b are similar to those of the power module 1 in FIGS. 1A to 5, and are not redundantly described herein. In the embodiment, the copper block 53a disposed on the second surface 12 of the substrate 10 includes a first exposed surface 531a and a second exposed surface 532a disposed on the top surface and the lateral surface of the second encapsulation layer 32. The second exposed surface 532a of the copper block 53a disposed on the lateral surface is protruded outwardly from the substrate 10 and the lateral surface of the second encapsulation layer 32. When the power module 1b is soldered and fixed, it is advantageous of utilizing the lateral surface of the copper block 53a to perform solder-climbing to enhance the reliability of the assembly.

Figure 18B:
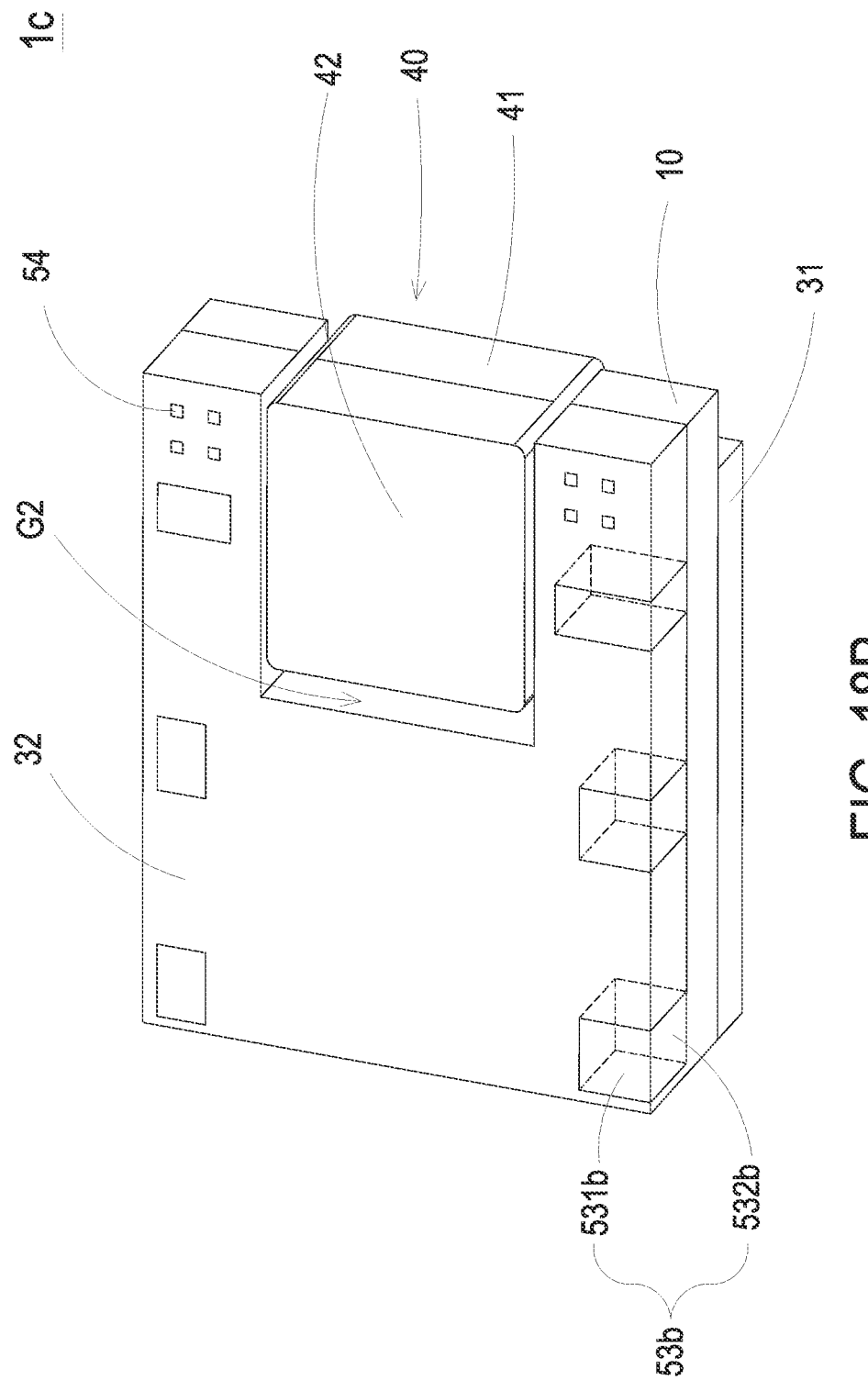
FIG. 18B is a perspective structural view illustrating a power module according to a fourth embodiment of the present disclosure.

FIG. 18B is a perspective structural view illustrating a power module according to a fourth embodiment of the present disclosure. In the embodiment, the structures, elements and functions of the power module 1c are similar to those of the power module 1b in FIG. 18A, and are not redundantly described herein. In the embodiment, the copper block 53b disposed on the second surface 12 of the substrate 10 includes a first exposed surface 531b and a second exposed surface 532b disposed on the top surface and the lateral surface of the second encapsulation layer 32. The first exposed surface 531b is coplanar with the top surface of the second encapsulation layer 32. The second exposed surface 532b is coplanar with the substrate 10 and the lateral surface of the second encapsulation layer 32. In the embodiment, after the second encapsulation layer 32 is formed by the molding process, the lateral surface of the second encapsulation layer 32 is polished, to expose the second exposed surface 532b of the copper block 53b, and electroplated, as shown in FIG. 18B. When the power module 1c is soldered and fixed, it is advantageous of utilizing the lateral surface to perform solder-climbing to enhance the reliability of the assembly.

Figure 18C:
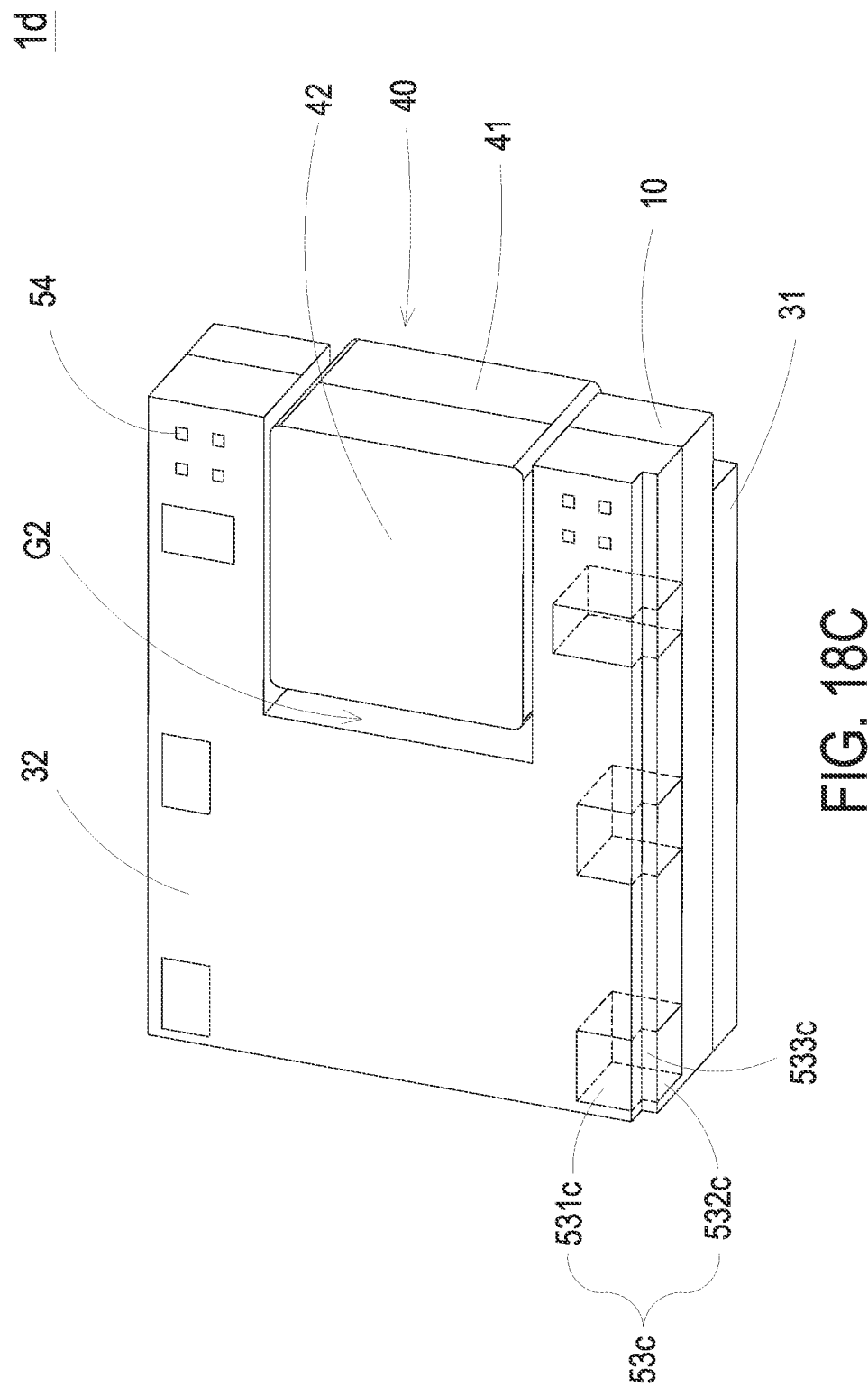
FIG. 18C is a perspective structural view illustrating a power module according to a fifth embodiment of the present disclosure.

FIG. 18C is a perspective structural view illustrating a power module according to a fifth embodiment of the present disclosure. In the embodiment, the structures, elements and functions of the power module 1d are similar to those of the power module 1c in FIG. 18B, and are not redundantly described herein. In the embodiment, the copper block 53c disposed on the second surface 12 of the substrate 10 includes a first exposed surface 531c and a second exposed surface 532c disposed on the top surface and the lateral surface of the second encapsulation layer 32. The first exposed surface 531c is coplanar with the top surface of the second encapsulation layer 32. The second exposed surface 532c is coplanar with the substrate 10 and the lateral surface of the second encapsulation layer 32. In the embodiment, the power module 1d further includes a step cut 533c connected to the top surface and the lateral surface of the second encapsulation layer 32 to form a stepped structure. Preferably but not exclusively, the step cut 533c is milled out at the adjacent junction of the top surface and the lateral surface of the second encapsulation layer 32 after the second encapsulation layer 32 is formed, and the surface of the step cut 533c is electroplated at the same time. A part of the step cut 533c is adjacent to the first exposed surface 531c and the second exposed surface 532c of the copper block 53c, as shown in FIG. 18C. Therefore, the stepped structure of the copper block 53c further enhances the reliability of the assembly. Whereby, the solder-climbing area is increased and the reliability of the power module 1d is enhanced. In another embodiment, the lateral surface of the copper block 53c is not exposed to the exterior of the second encapsulation layer 32. Therefore, at the position corresponding to the copper block 53c, the step cut 533c, the lateral surface of the second encapsulation layer 32 and the first exposed surface 531c of the copper block 53c are adjacent to each other.

Figure 19A:
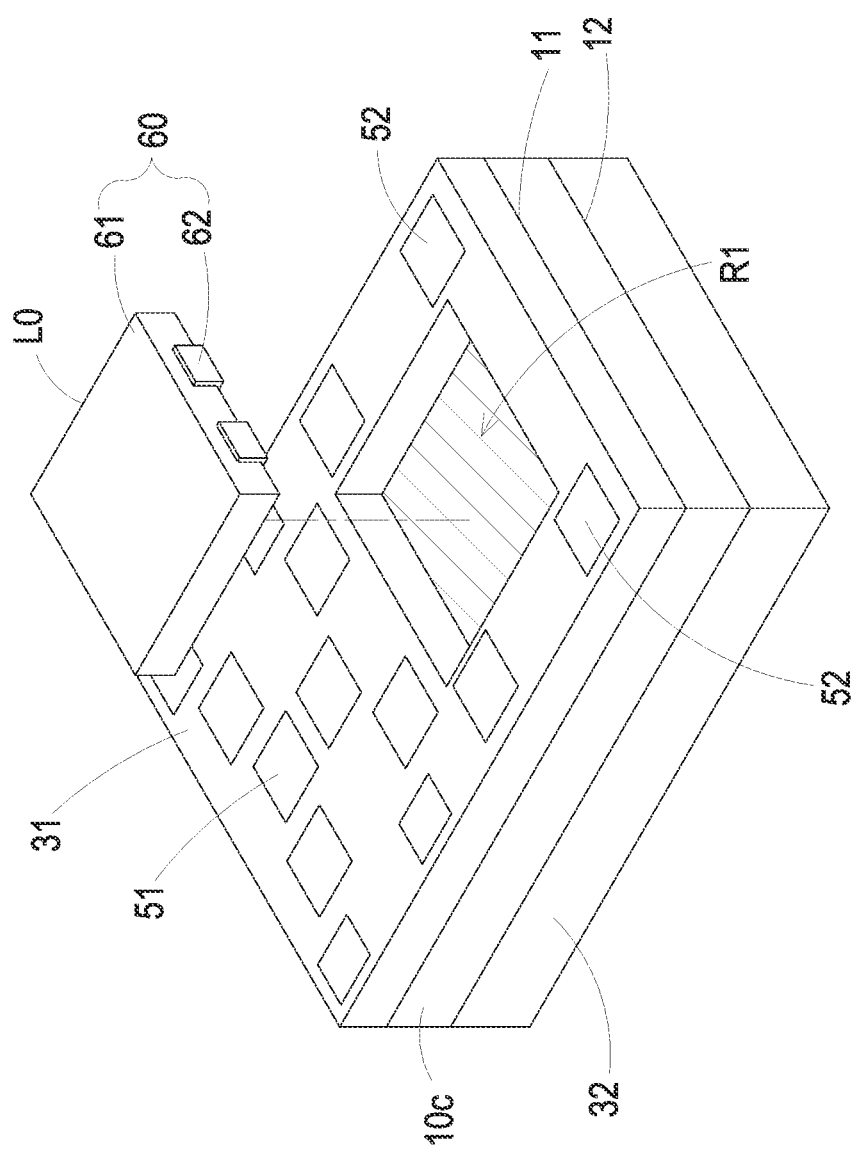
FIG. 19A is an exploded view illustrating a power module according to a sixth embodiment of the present disclosure.
Figure 19B:
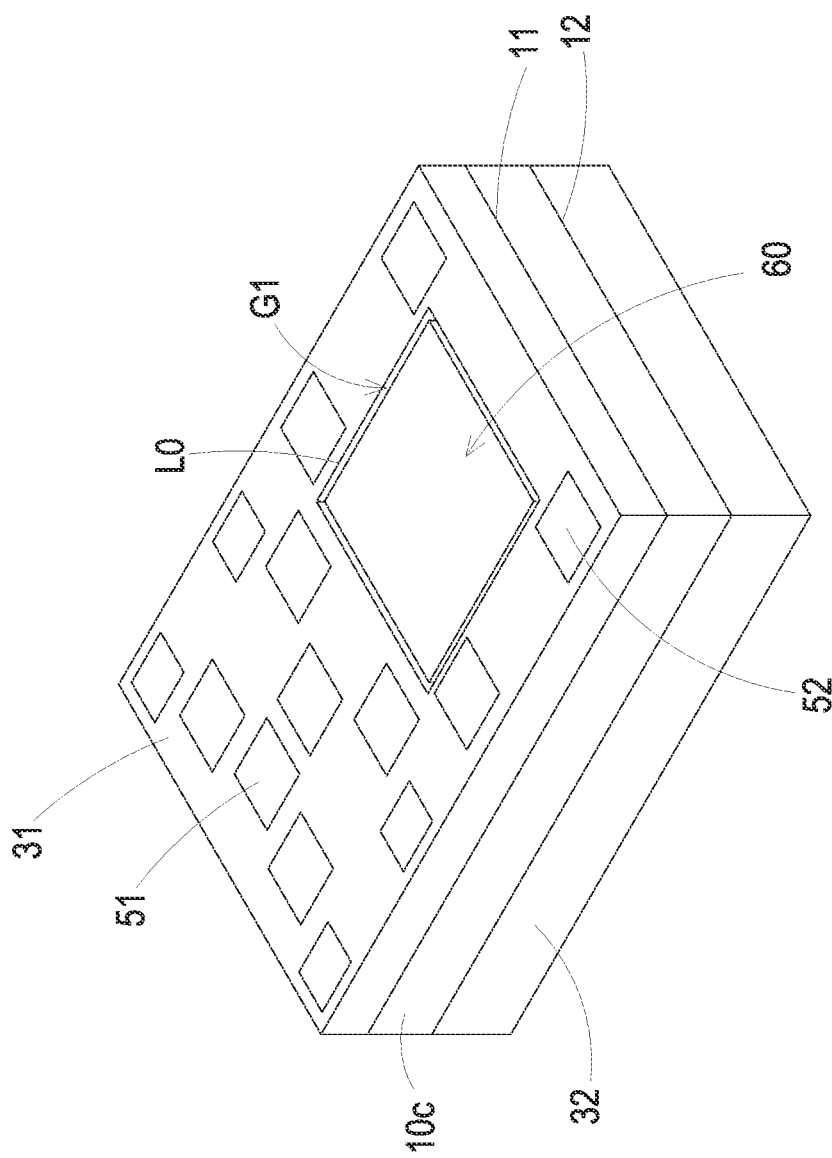
FIG. 19B is a perspective structural view illustrating the power module according to the sixth embodiment of the present disclosure.

FIG. 19A is an exploded view illustrating a power module according to a sixth embodiment of the present disclosure. FIG. 19B is a perspective structural view illustrating the power module according to the sixth embodiment of the present disclosure. In the embodiment, the structures, elements and functions of the power module 1e are similar to those of the power module 1 in FIGS. 1A to 5, and are not redundantly described herein. In the embodiment, the magnetic component 60 of the power module 1e includes a discrete magnetic component 60. Preferably but not exclusively, a winding 62 and a magnetic powder material are integrated to form the discrete magnetic component 60. In an embodiment, a winding 62 is wound on or around the magnetic core 61 to form the discrete magnetic component 60. The four edges of the lateral periphery L0 of the magnetic component 60 are surrounded by the first encapsulation layer 31. In the embodiment, the manufacturing method of the power module 1e is the same as the manufacturing method of the power module 1 in the previous embodiment. Different from the power module 1, the power module 1e includes the electronic components disposed around the working region R1 for assembling the magnetic component 60. When the working region R1 on the substrate 10c is realized through the encapsulation mould, the corresponding position of the protruding block of the encapsulation mould is offset from the edges of the substrate 10c. In that, the protruding block is utilized to press the working region R1 tightly to block the inflow of the encapsulation material during the molding process. After removing the encapsulation mould, a cavity is formed for assembling the magnetic component 60. Certainly, the present disclosure is not limited thereto.

From the foregoing descriptions, it is known that the structure of the power module 1 is optimized in the present disclosure. The encapsulation layer 30 and the magnetic component 40 are misaligned with each other on the installation spaces of the substrate 10. Whereby, the problem of loss increasing of the transformer due to the encapsulation material is solved. It should be emphasized that the shape, the number, the combination and the arrangement of the magnetic component 40, and the working region R1 and the working region R2 for the assembly and installation of the magnetic component 40 are adjustable according to the practical requirements. Moreover, the shape, the size and the layout timing of the perforation 13 are adjustable according to the practical requirements. The present disclosure is not limited thereto, and not redundantly described herein.

In summary, the present disclosure provides a power module and a manufacturing method thereof. With the arrangement of the encapsulation material not overlapped to the position of the transformer, an optimized and stable structural assembly is obtained, and the procedure is simplified. Moreover, it prevents the increasing of the loss due to the stress generated by the encapsulation material covering the magnetic core of the transformer. At the same time, a copper block is embedded in the encapsulation process to reduce the thermal resistance of the power module and further improve the competitiveness of the power module. In addition, by optimizing the design of the encapsulation mould, it is misaligned with the installation position of the magnetic core of the transformer. For example, the encapsulation procedure is performed before the magnetic core of the transformer is assembled on the substrate, so that the encapsulation material is not in contact with the magnetic core of the transformer. It effectively avoids the increase of the transformer loss. Furthermore, a plurality of power modules are produced by encapsulating together through a panel and then assembling the magnetic components thereon. It is helpful of integrating and simplifying the manufacturing process of the power modules. Moreover, the purpose of enhancing the structural stability and reducing the manufacturing costs are achieved at the same time.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module comprising:
    a substrate, comprising a first surface, a second surface and a working region, wherein the first surface and the second surface are opposite to each other, and the working region is disposed on the first surface or the second surface;
    an electronic component, disposed on the substrate;
    a magnetic component, disposed on the working region of the substrate and having a lateral periphery; and
    an encapsulation layer disposed on the substrate, covering the electronic component and at least partially surrounding the lateral periphery of the magnetic component, wherein the encapsulation layer comprises an avoidance space, so that a projection of the encapsulation layer on the first surface of the substrate is not overlapped with a projection of the working region on the first surface of the substrate, and a gap is formed between the encapsulation layer and the lateral periphery of the magnetic component, wherein the avoidance space is equal to a sum of space of the working region and the gap.

2. The power module according to claim 1, wherein the gap is greater than or equal to 0.2 mm.

3. The power module according to claim 1, wherein the substrate is a printed circuit board.

4. The power module according to claim 1, wherein the substrate further comprises a perforation, and the perforation is located in the working region and passed through the first surface and the second surface.

5. The power module according to claim 4, wherein the magnetic component comprises a first magnetic core and a second magnetic core, and the first magnetic core and the second magnetic core are fastened to the substrate through the perforation.

6. The power module according to claim 1, wherein the encapsulation layer at least surrounds more than half of the lateral periphery.

7. The power module according to claim 1, wherein the lateral periphery includes four lateral edges of the magnetic component, and the encapsulation layer surrounds at least two of the four lateral edges.

8. The power module according to claim 1, wherein the electronic component is disposed on the first surface of the substrate, the encapsulation layer covers the electronic component, and the encapsulation layer and the magnetic component cover the first surface of the substrate, respectively, wherein a height of the magnetic component on the first surface is less than or equal to a height of the encapsulation layer on the first surface.

9. The power module according to claim 1, wherein the electronic component is disposed on the first surface and the second surface of the substrate, and the encapsulation layer covers the electronic component disposed on the first surface and the second surface of the substrate.

10. The power module according to claim 1, further comprising a copper block disposed on the substrate directly or indirectly.

11. The power module according to claim 10, wherein the copper block is disposed on the electronic component, and exposed to an exterior of the encapsulation layer to form a heat dissipation surface.

12. The power module according to claim 10, wherein the copper block is exposed to an exterior of the encapsulation layer to form an input pin or an output pin of the power module.

13. The power module according to claim 10, wherein the copper block comprises a first exposed surface and/or a second exposed surface, the first exposed surface is located on a top surface of the encapsulation layer, and the second exposed surface is located on a lateral surface of the encapsulation layer.

14. The power module according to claim 13, further comprising a stepped cut connected to the top surface of the encapsulation layer and the lateral surface of the encapsulation layer to form a stepped structure.

15. The power module according to claim 1, wherein the magnetic component is a discrete magnetic component and disposed on the working region.

* * * * *